12) United States Patent
Conway et al.

(10) Patent No.: US 9,392,708 B2
(45) Date of Patent: Jul. 12, 2016

(54) MODULAR ENCLOSURE

(71) Applicant: Tyco Electronics Corporation, Berwyn, PA (US)

(72) Inventors: Bruce R. Conway, La Honda, CA (US); Hyo Chang Yun, Saratoga, CA (US); Peter J. Dutton, Fremont, CA (US); Thomas D. Ratzlaff, Menlo Park, CA (US); Paul Craig Tally, Santa Clara, CA (US); James O'Keeffe, Newark, CA (US); Erling Hansen, Redwood City, CA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 0 days.

(21) Appl. No.: 14/245,588

(22) Filed: Apr. 4, 2014

(65) Prior Publication Data
US 2015/0289388 A1 Oct. 8, 2015

(51) Int. Cl.
A47B 87/00 (2006.01)
H05K 5/00 (2006.01)
H05K 7/14 (2006.01)

(52) U.S. Cl.
CPC ............ *H05K 5/0021* (2013.01); *H05K 7/1425* (2013.01); *H05K 7/1471* (2013.01)

(58) Field of Classification Search
CPC .. A47B 87/02; A47B 87/008; A47B 47/0025; A47B 47/0033; A47B 47/0041; A47B 47/005; A47B 47/047; A47B 47/007; A47B 45/00; H05K 5/0021; H05K 5/004; H05K 5/0217; H05K 5/0247; H05K 7/1425; H05K 7/1471

USPC .................................................. 108/108, 111
See application file for complete search history.

(56) References Cited

U.S. PATENT DOCUMENTS

| | | | | |
|---|---|---|---|---|
| 3,754,806 A | * | 8/1973 | Nakagawa | A47B 67/005 312/108 |
| 3,854,783 A | * | 12/1974 | Teranishi | A47B 47/00 108/157.13 |
| 4,379,604 A | * | 4/1983 | Rock | A47B 88/0014 312/111 |
| 4,470,647 A | * | 9/1984 | Bishoff | F16B 5/07 312/108 |
| 4,592,601 A | * | 6/1986 | Hlinsky | A47B 87/02 206/504 |
| 5,016,946 A | * | 5/1991 | Reznikov | G11B 33/0433 312/108 |
| 5,564,806 A | * | 10/1996 | Keisling | A47B 47/0033 312/107 |
| 5,647,181 A | * | 7/1997 | Hunts | A63H 33/10 312/111 |

(Continued)

Primary Examiner — Hanh V Tran

(57) ABSTRACT

An enclosure includes a plurality of modular construction units that connect together to at least partially define an internal compartment of the enclosure. Each construction unit includes a wall segment extending a length from a corner end to a free end, and a corner segment extending outward from the corner end of the wall segment. The corner segment is integrally formed with the wall segment. The corner segment includes a receiver socket that is configured to receive the free end of another corresponding construction unit therein to connect the construction units together. The construction units connect together one after the other with a chasing symmetry to define the internal compartment of the enclosure.

21 Claims, 16 Drawing Sheets

(56) References Cited

U.S. PATENT DOCUMENTS

| | | | | |
|---|---|---|---|---|
| 5,921,647 A * | 7/1999 | Schneider | A47B 47/05 | 211/187 |
| 5,975,660 A * | 11/1999 | Tisbo | A47B 87/0207 | 312/108 |
| 6,120,116 A * | 9/2000 | Phillips | A47B 47/0041 | 211/41.17 |
| 6,193,340 B1 * | 2/2001 | Schenker | A47B 47/0075 | 312/108 |
| 6,250,022 B1 * | 6/2001 | Paz | E04B 1/34321 | 312/100 |
| 6,474,759 B2 * | 11/2002 | Hsu | A47B 47/042 | 312/108 |
| 6,532,707 B1 * | 3/2003 | Ian Cannon | A01G 1/08 | 312/111 |
| 6,698,851 B1 * | 3/2004 | Ludl | H05K 5/0021 | 312/108 |
| 6,820,950 B1 * | 11/2004 | Sun | A47B 47/042 | 312/108 |
| 7,815,264 B2 * | 10/2010 | Lin | G06F 1/181 | 312/108 |
| 7,922,417 B2 * | 4/2011 | Jimenez | A47B 47/0083 | 108/193 |
| 8,967,738 B2 * | 3/2015 | Blase | A47B 47/04 | 211/144 |
| 2002/0043905 A1 * | 4/2002 | Insalaco | A47B 47/05 | 312/108 |
| 2002/0125799 A1 * | 9/2002 | Landsberger | A47B 47/0091 | 312/209 |
| 2005/0104483 A1 * | 5/2005 | Saravis | A47B 47/0033 | 312/111 |
| 2005/0110371 A1 * | 5/2005 | Li | A47B 87/0215 | 312/108 |

* cited by examiner

MODULAR ENCLOSURE

BACKGROUND OF THE INVENTION

The subject matter disclosed herein relates generally to modular enclosures.

Modular enclosures are known for containing electrical devices (such as circuit boards, actuators, avionics, automotive electronics, and/or the like) and non-electrical devices. For example, many avionics components located on-board aircraft and many automotive electronic components located on-board automobiles are housed in modular electronics enclosures. Known modular electronics enclosures include conventional rail and panel boxes that are built using modular corner rails that include two opposite receivers for receiving two modular side panels. A plurality of side panels and corner rails are connected together to build the finished enclosure.

Known modular electronics enclosures are not without disadvantages. For example, known modular electronics enclosures such as rail and panel boxes may include a relatively large number of joints, which may decrease a rigidity of the enclosure. Moreover, differently configured molds, extrusion dies, and/or the like may be required to fabricate the modular components of known enclosures that have different sizes and/or shapes, which may increase the cost and/or production time of such known enclosures. Further, at least some known modular electronics enclosures are fabricated from metals, which add weight to such enclosures. Known modular electronics enclosures may also have difficulty providing covers that adequately close open ends, tops, and/or bottoms of the enclosure.

BRIEF DESCRIPTION OF THE INVENTION

In one embodiment, an enclosure includes a plurality of modular construction units that connect together to at least partially define an internal compartment of the enclosure. Each construction unit comprises a wall segment extending a length from a corner end to a free end, and a corner segment extending outward from the corner end of the wall segment. The corner segment is integrally formed with the wall segment. The corner segment includes a receiver socket that is configured to receive the free end of another corresponding construction unit therein to connect the construction units together. The construction units connect together one after the other with a chasing symmetry to define the internal compartment of the enclosure.

DETAILED DESCRIPTION OF THE INVENTION

Figure 1:
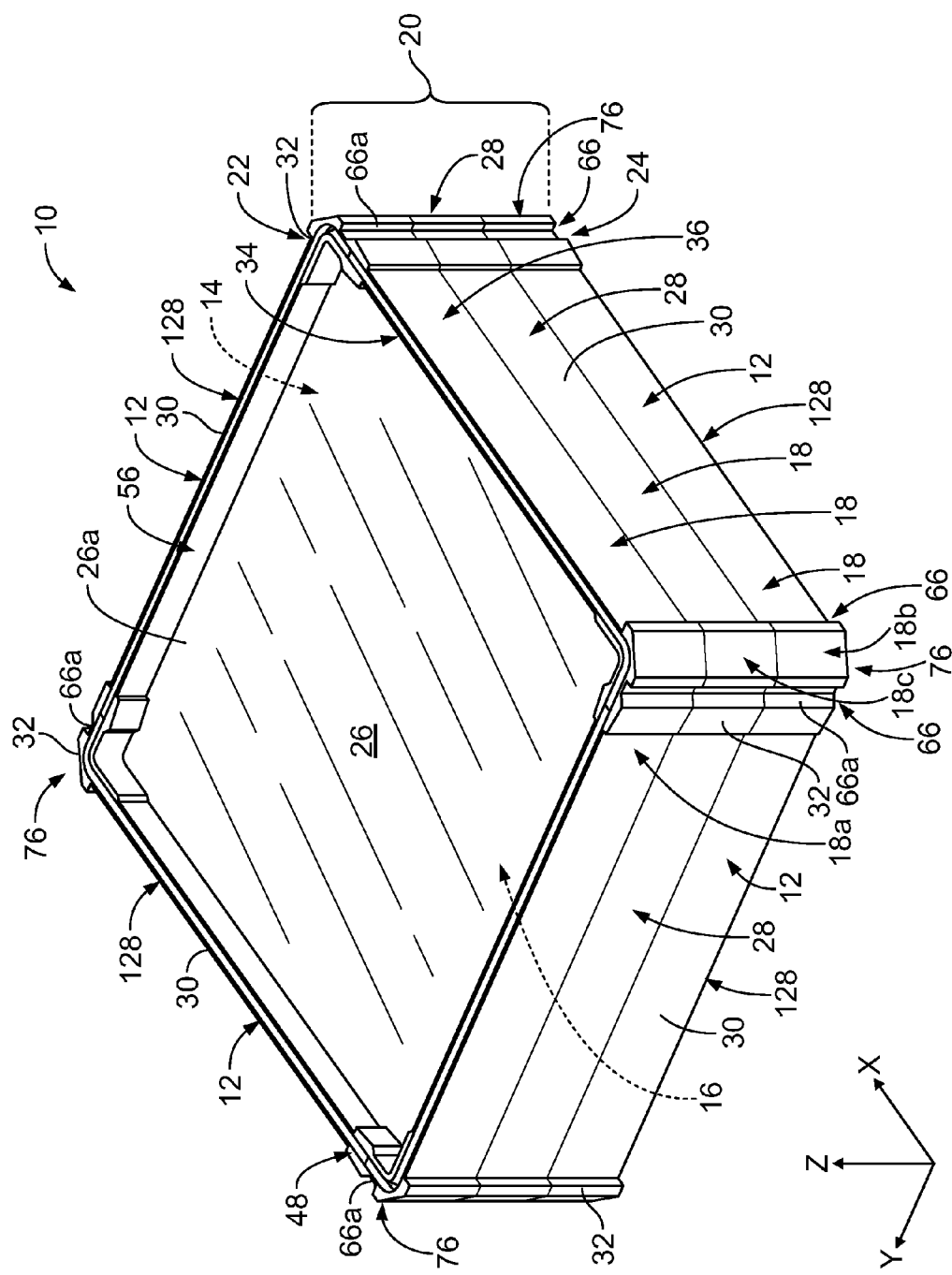
FIG. 1 is perspective view of an exemplary embodiment of an enclosure.

FIG. 1 is perspective view of an exemplary embodiment of an enclosure 10. The enclosure 10 includes a plurality of sidewalls 12 and an internal compartment 14 defined between the sidewalls 12. In the exemplary embodiment, the enclosure 10 is configured to enclose one or more electronic devices 16 (explicitly shown in FIGS. 6 and 10) that are received within the internal compartment 14. But, the enclosures described and/or illustrated herein are not limited to enclosing electronic devices. Rather, the enclosures described and/or illustrated herein may enclose any structure, device, material, and/or the like and any combination different structures, devices, materials, and/or the like, such as, but not limited to, electronic devices, mechanical devices, chemicals, chemical devices, optical devices, acoustic devices, nuclear devices, and/or the like. In the remainder of the Detailed Description, the enclosure 10 will be referred to as "electronics enclosure 10".

The electronics enclosure 10 may hold any number of electronic devices 16 and each electronic device 16 may be any type of electronic device, such as, but not limited to, circuit boards, actuators, avionics, automotive electronics, vehicle electronics, electrical power supplies, electrical power distribution components, electrical power distribution systems, antennas, controllers, processors, memories, storage devices, communication components, communication systems, passive electronic devices, active electronic devices, and/or the like.

A coordinate system is labeled in FIG. 1. The electronics enclosure 10 extends a width along an x-axis of the coordinate system, a length along a y-axis of the coordinate system, and a height along a z-axis of the coordinate system. The electronics enclosure 10 is defined by a plurality of z-axis sections 18 that are arranged within a stack 20 along the z-axis, as is shown in FIG. 1. Specifically, the z-axis sections 18 are stacked on top of each other along the z-axis to define the height of the electronics enclosure 10. The stack 20 includes end z-axis sections 18a and 18b that define respective ends 22 and 24 of the height of the electronics enclosure 10. One or more interior z-axis sections 18c are positioned within the stack 20 between the end z-axis sections 18a and 18b. Although three are shown, the electronics enclosure 10 may be defined by (i.e., may include) any number of z-axis sections 18. In some embodiments, the electronics enclosure 10 is defined by only a single z-axis section 18. Each of the z-axis sections 18 may be referred to herein as a "first", a "second", and/or a "third" z-axis section. Moreover, each of the z-axis sections 18 may be referred to herein as an "additional" z-axis section.

Optionally, one or more of the z-axis sections 18 includes a cover 26 that defines a boundary of the internal compartment 14 of the electronics enclosure 10. Specifically, while the sidewalls 12 define x-axis and y-axis boundaries of the internal compartment 14, the cover 26 defines a z-axis boundary of the internal compartment 14. In the exemplary embodiment of the electronics enclosure 10, both of the end z-axis sections 18a and 18b within the stack 20 includes a respective cover 26a and 26b. The cover 26b is not visible in FIG. 1, but can be seen in FIGS. 8-10. The cover 26a of the end z-axis section 18a defines a z-axis boundary at the end 22 of the electronics enclosure 10, while the cover 26b of the end z-axis section 18b defines a z-axis boundary at the opposite end 24 of the electronics enclosure 10. Optionally, one or more active devices (not shown) are mounted on and/or incorporated into the cover 26a and/or one or more active devices are mounted on and/or incorporated into the cover 26b. The active devices are accessible along the exterior of the electronics enclosure 10. Examples of such active devices include, but are not limited to, displays, membrane switches, enunciators, and/or the like.

As will be described below, each z-axis section 18 of the electronics enclosure 10 is defined by a plurality of modular construction units 28. Specifically, a plurality of the construction units 28 connect together one after the other with a chasing symmetry to form a z-axis section 18. The construction units 28 and the z-axis sections 18 define near finished components that can be used as building blocks to construct an enclosure of arbitrary size from a set of near finished components used repetitiously. Each of the construction units 28 includes a wall segment 30 and a corner segment 32. The wall segments 30 of the construction units 28 define the sidewalls 12 of the electronics enclosure 10. The construction units 28 are described in more detail below with reference to FIGS. 2 and 3. The construction units 28 may be referred to herein as "first" and/or "second" construction units.

Figure 2:
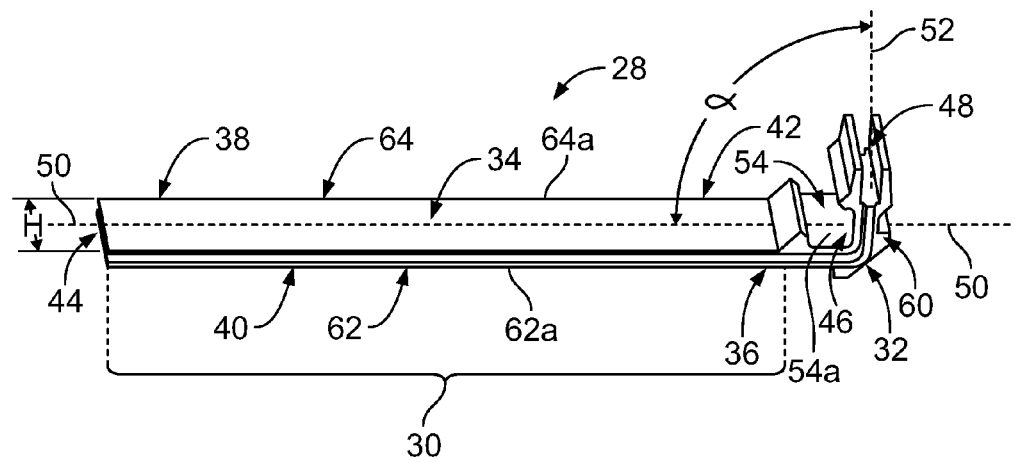
FIG. 2 is a perspective view of an exemplary embodiment of a modular construction unit of the enclosure shown in FIG. 1.
Figure 3:
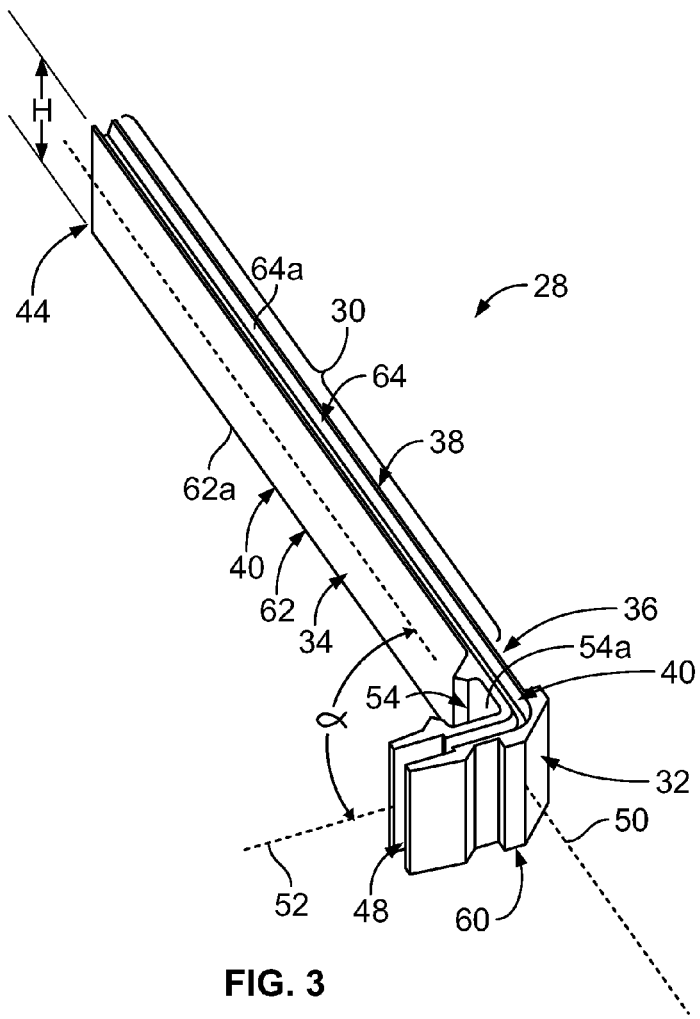
FIG. 3 is another perspective view of the construction unit shown in FIG. 2 viewing the construction unit from a different angle than FIG. 2.

FIGS. 2 and 3 are perspective views of an exemplary embodiment of a construction unit 28. The construction unit 28 includes a wall segment 30 and a corner segment 32. The wall segment 30 and the corner segment 32 are integrally formed with each other to define the "one-piece" structure of the construction unit 28. In other words, the integral formation of the wall segment 30 and the corner segment 32 provide the construction unit 28 as a single continuous structure that has only one piece. The construction unit 28 may be fabricated using any process, method, means, structure, machine, and/or the like that provides the construction unit 28 with the "one-piece" structure described and illustrated herein, such as, but not limited to, using a molding process (e.g., injection molding and/or the like), using a casting process, using a machining and/or other cutting process, using an extrusion process, and/or the like.

The construction unit 28 includes an internal side 34 and an opposite external side 36. The construction unit 28 extends a height along the z-axis from an edge 38 to an opposite edge 40.

The wall segment 30 of the construction unit 28 extends a length from a corner end 42 to a free end 44 that is opposite the corner end 42. In the exemplary embodiment of the construction unit 28, the length of the wall segment 30 extends along an approximately straight path between the ends 42 and 44. In other embodiments, the length of the wall segment 30 extends along an angled and/or curved path between the ends 42 and 44. The wall segment 30 extends a height H along the z-axis from the edge 38 to the edge 40 of the construction unit 28. As will be described below, the length of the wall segment 30 is trimmable to provide the electronics enclosure 10 with a pre-selected x-axis or y-axis dimension (depending on whether the length of the wall segment 30 extends along the x-axis or the y-axis). It should be understood that for some shapes, different wall segments 30 of the same z-axis section 18 may have lengths that have different dimensional values.

The corner segment 32 extends outward from the corner end 42 of the wall segment 30. The corner segment 32 includes a base 46 that extends from the wall segment 30, and a receiver socket 48 that extends outward from the base 46. The receiver socket 48 is configured to receive the free end 44 of another construction unit 28 therein to connect the construction units 28 together, as will be described below. The receiver socket 48 has a size and shape that is configured to receive the free end 44 of another construction unit 28 therein in a manner that enables the construction units 28 to be mechanically connected together, for example as is described below with reference to FIG. 6. In the exemplary embodiment of the construction unit 28, the receiver socket 48 has the shape of a parallelepiped. But, the receiver socket 48 may additionally or alternatively include any other size and/or shape that enables the construction units 28 to be mechanically connected together.

In the exemplary embodiment of the construction unit 28, the receiver socket 48 extends at angle of approximately 90° relative to the length of the wall segment 30. Specifically, the wall segment 30 extends the length along a central longitudinal axis 50 and the receiver socket 48 extends a depth along a central depth axis 52. As can be seen in FIGS. 2 and 3, the axes 50 and 52 extend at an approximate perpendicular angle α relative to each other. In other embodiments, the receiver socket 48 extends at different angle relative to the length of the wall segment 30, as will be discussed below.

The corner segment 32 includes one or more internal mounting features 54 for mounting one or more electronic and/or other devices 16 (FIGS. 6 and 10) to the construction unit 28. The mounting feature 54 may be used in combination with the mounting features 54 of other construction units 28 of the same z-axis section 18 to hold the electronic and/or other device(s) 16 within an internal cavity 56 (FIGS. 1, 6, 9, and 10) of the z-axis section 18. The internal mounting feature 54 extends on the internal side 34 of the construction unit 28. In the exemplary embodiment of the construction unit 28, the internal mounting feature 54 is a groove 54a that is configured to receive a mounting bracket 58 (FIGS. 6 and 10) that is either a component of, or is mechanically connected to, the electronic and/or other device(s) 16. The groove 54a may be considered a keying feature that receives a key 72 (FIGS. 6 and 10) of the mounting bracket 58 therein. In the exemplary embodiment of the groove 54a, the groove 54a receives the key 72 with an interference fit. In addition or alternatively to the groove 54a, the internal mounting feature 54 may include any other structure that enables the construction unit 28 to be mechanically connected to the electronic and/or other device(s) 16, such as, but not limited to, an opening that receives a fastener therein, a slot, a clip, a latch, a clamp, a different interference-fit member, a snap-fit member, and/or the like. Moreover, in addition or alternatively to the internal mounting feature 54 on the corner segment 32, the construction unit 28 may include one or more internal mounting features 54 positioned at another location along the construction unit 28, for example along the wall segment 30. A common spider assembly (not shown) is optionally mounted to the mounting features 54 of corresponding (e.g., aligned along the z-axis) corner segments 32 of different z-axis sections 18 to increase the rigidity of an assembled electronics enclosure 10. The spider assembly may include framework (e.g., a web of framework) that reinforces the corner segments 32 of the z-axis sections 18.

Optionally, the corner segment 32 includes a strengthening boss 60 for increasing the strength, rigidity, mechanical integrity, and/or the like of the electronics enclosure 10, for example at the corners thereof. In the exemplary embodiment, the strengthening boss 60 is an area of increased thickness on the external side 36 of the construction unit 28. In addition or alternatively, the construction unit 28 may include a strengthening boss positioned at another location along the construction unit 28. The strengthening boss 60 may have any size and/or shape, which may be configured to provide the electronics enclosure 10 with a predetermined strength, rigidity, mechanical integrity, and/or the like.

The construction unit 28 optionally includes one or more reinforcement ribs (not shown) that extends along the wall segment 30 and/or the corner segment 32 on the internal side 34 and/or the external side 36 of the construction unit 28. Such reinforcement ribs may facilitate increasing the rigidity of the corresponding z-axis section 18 along the x-axis and y-axis dimensions of the corresponding z-axis section 18.

Figure 10:
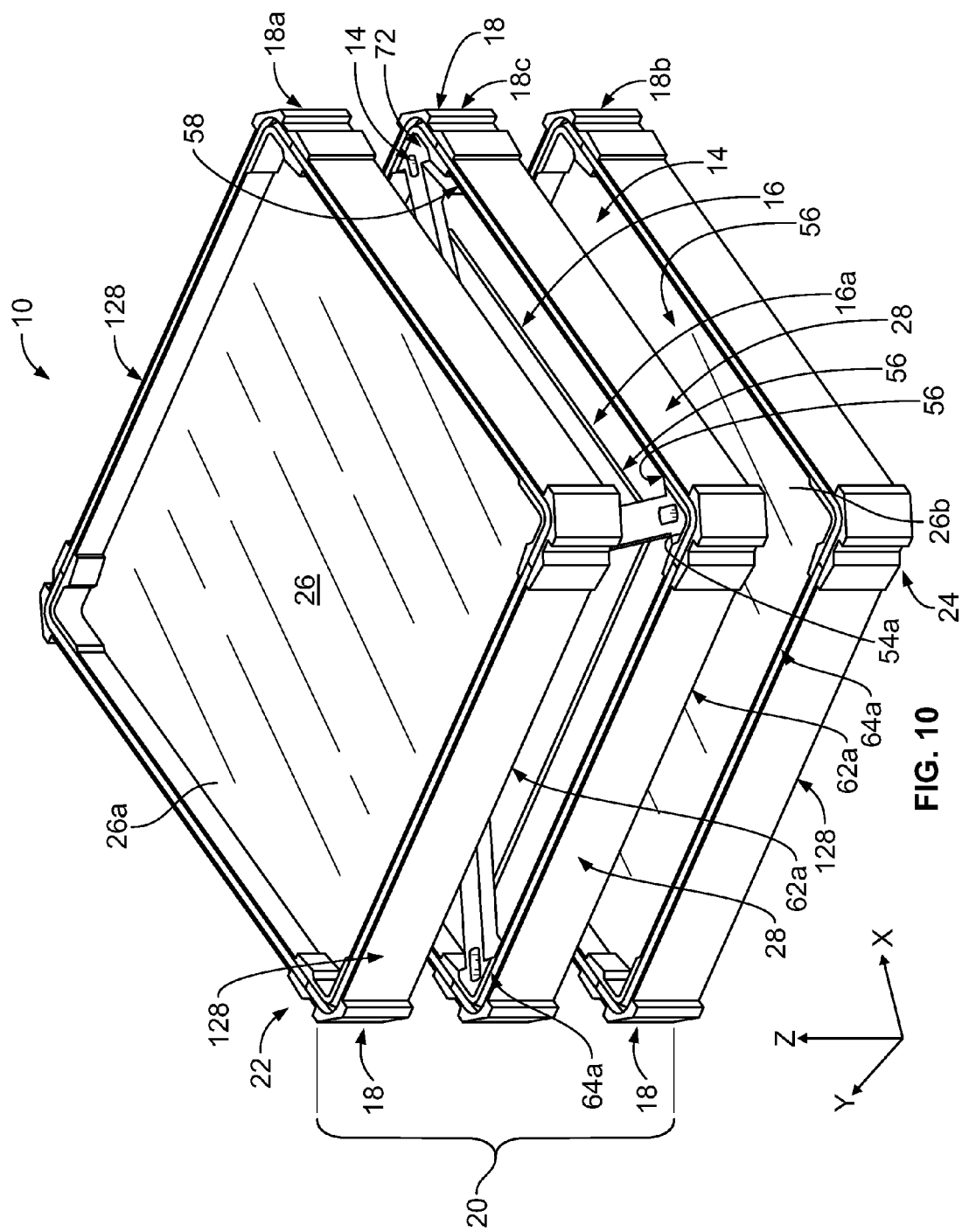
FIG. 10 is an exploded perspective view of the enclosure shown in FIG. 1.

The construction unit 28 includes one or more stacking features 62 (best seen in FIG. 2) that extend along the edge 40 of the construction unit 28 for stacking the z-axis section 18 of the construction unit 28 on another z-axis section 18. The construction unit 28 also includes one or more stacking features 64 (best seen in FIG. 3) that extend along the edge 38 of the construction unit 28 for stacking another z-axis section 18 on the z-axis section 18 of the construction unit 28. The stacking features 62 and 64 enable z-axis sections 18 to be stacked and mechanically connected together within the stack 20 (FIGS. 1 and 10). Specifically, the stacking feature 62 of the one-piece construction 28 interlocks with the stacking feature 64 of a construction unit 28 of another z-axis section 18 that is stacked on the z-axis section 18 of the construction unit 28. Similarly, the stacking feature 64 of the one-piece construction 28 interlocks with the stacking feature 62 of a construction unit 28 of another z-axis section 18 on which the z-axis section 18 of the construction unit 28 is stacked. The stacking features 62 and 64 of the construction units 28 of two stacked z-axis sections 18 thus interlock the stacked z-axis sections 18 within the stack 20.

In the exemplary embodiment of the construction unit 28, the stacking features 62 and 64 are tongue and groove joints, respectively. Specifically, as respectively shown in FIGS. 2 and 3, the stacking feature 62 is a tongue 62a and the stacking feature 64 is a groove 64a. The tongue 62a of the construction unit 28 interlocks with the groove 64a of a construction unit 28 of another z-axis section 18 such that the tongue 62a nests within the groove 64a. The groove 64a of the construction unit 28 interlocks with the tongue 62a of a construction unit 28 of another z-axis section 18 such that the tongue 62a nests within the groove 64a of the other z-axis section 18. The stacking features 62 and 64 of the construction unit 28 are not limited to the tongue and groove joints 62a and 64a. Rather, in addition or alternatively to the tongue and groove joints 62a and 64a, the stacking features 62 and 64 may include any other structure that enables the construction unit 28 to be stacked on another z-axis section 18, such as, but not limited to, a lap joint, and/or the like.

Referring again to FIG. 1, the corner segment 32 includes one or more external mounting features 66 for mounting one or more support structures to the electronics enclosure 10. The support structures that mount to the electronics enclosure 10 facilitate supporting, mounting, compression, and/or the like of the electronics enclosure 10. Such support structures may include, but are not limited to, support feet that support the enclosure 10 on a surface, support rails (e.g., the support rails 373 shown in FIG. 15) that are used to securely connect the enclosure 10 to another support structure (e.g., a wall, a floor, a ceiling, a rack, a panel, a frame, an airframe, a rail, and/or the like), and/or the like. The external mounting feature 66 extends on the external side 36 of the construction unit 28.

In the exemplary embodiment of the construction unit 28, the external internal mounting features 66 are grooves 66a that are configured to receive a key (not shown) of the support structure for mounting the support structure to the construction unit 28. In addition or alternatively to the grooves 66a, the external mounting feature 66 may include any other structure that enables the support structure to be mounted to the construction unit 28, such as, but not limited to, an opening that receives a fastener, a clip, a slot, a latch, an interference-fit member, a snap-fit member, an angled foot receiver for entrapping a foot and/or a rail, and/or the like. Moreover, in addition or alternatively to the external mounting feature 66 on the corner segment 32, the construction unit 28 may include one or more external mounting features 66 positioned at another location along the construction unit 28, for example along the wall segment 30.

Figure 4:
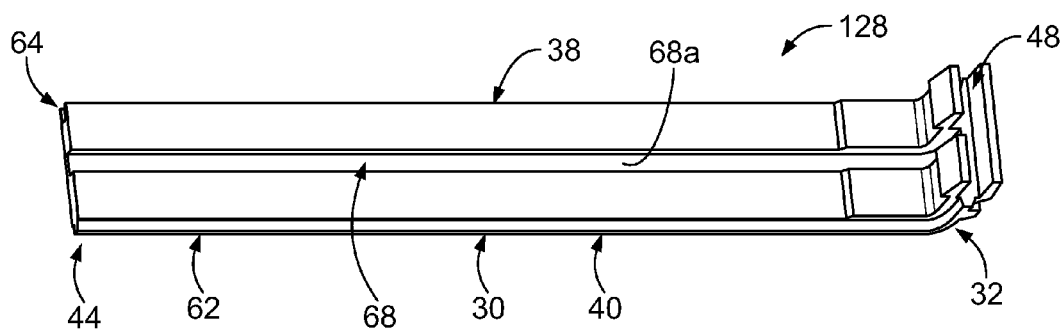
FIG. 4 is a perspective view of an exemplary embodiment of another modular construction unit.

As described above, one or more of the z-axis sections 18 includes a cover 26 that defines a z-axis boundary of the internal compartment 14 of the electronics enclosure 10. FIG. 4 is a perspective view of an exemplary embodiment of a modular construction unit 128 of a z-axis section 18 (FIGS. 1, 5, 6, and 8-10) that includes a cover 26 (FIGS. 1 and 8-10), for example the z-axis section 18a shown in FIG. 1. The construction unit 128 is substantially similar to the construction unit 28 (FIGS. 1-3, 5, 6, and 10). For example, the construction unit 128 includes a wall segment 30 and a corner segment 32 that are integrally formed with each other to define the "one-piece" structure of the construction unit 128. The wall segments 30 include free ends 44 and the corner segments 32 include receiver sockets 48. Moreover, and for example, the construction unit 128 extends a height along the z-axis from an edge 38 to an opposite edge 40. But, the construction unit 128 also includes a cover mounting feature 68 for incorporating a cover 26 into the z-axis section 18 of the construction unit 128. The construction units 28 may be referred to herein as "first" and/or "second" construction units.

Moreover, the construction unit 128 optionally only includes the stacking feature 62 or the stacking feature 64. For example, if the z-axis section 18 of the construction unit 128 is an end z-axis section that defines one of the ends 22 or 24 of the electronics enclosure 10, the end z-axis section 18 will only need one of the stacking feature 62 or the stacking feature 64 because the end z-axis section 18 is only directly mechanically connected to one other z-axis section within the stack 20. In such embodiments wherein the construction unit 128 only includes the stacking feature 62 or the stacking feature 64, which stacking feature 62 or 64 the unit 128 includes will depend on which end 22 or 24 of the electronics enclosure 10 is defined by the end z-axis section 18. In the exemplary embodiment of the construction unit 128, the construction unit 128 includes both the stacking features 62 and 64.

In the exemplary embodiment of the construction unit 128, the cover mounting feature 68 is a slot 68a that receives an edge 74 (FIGS. 8 and 9) of the cover 26 therein to hold the cover 26 to the construction unit 128, as will be described in more detail below. As shown in FIG. 4, the slot 68a extends along the z-axis at approximately a midpoint of the height of the construction unit 128. But, the slot 68a may have any other position along the height of the construction unit 128. In addition or alternatively to the slot 68a, the cover mounting feature 68 may include any other structure that enables the construction unit 128 to hold the cover 26, such as, but not limited to, a ledge, a clip, a latch, an interference-fit member, a snap-fit member, an opening that receives a fastener therein, and/or the like.

Figure 5:
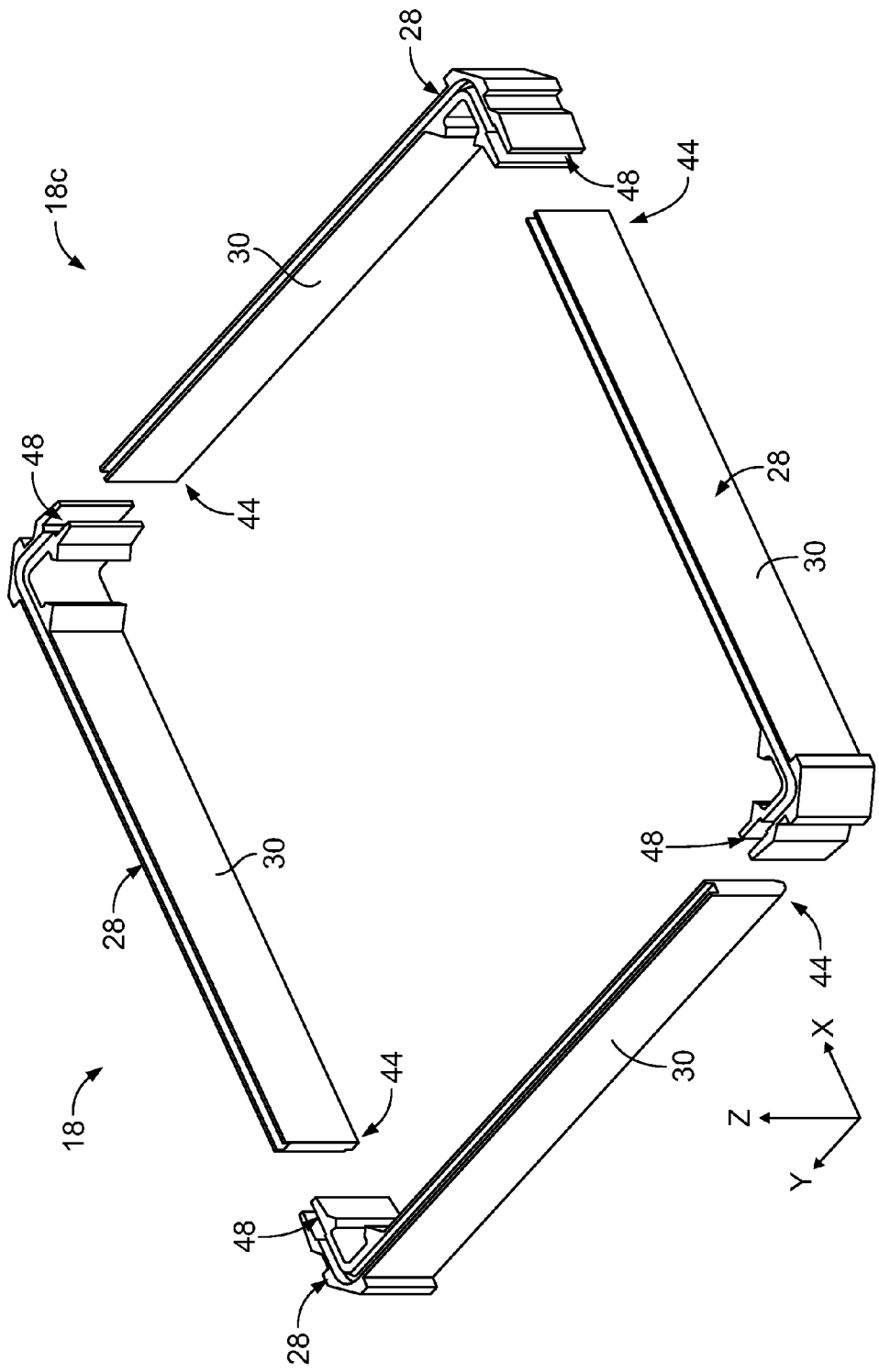
FIG. 5 is an exploded perspective view of an exemplary embodiment of a z-axis section of the enclosure shown in FIG. 1.

FIG. 5 is an exploded perspective view of an exemplary embodiment of the z-axis section 18c of the electronics enclosure 10. As shown in FIG. 1, the z-axis section 18c is an interior z-axis section 18 within the stack 20 that does not include a cover 26. Referring again to FIG. 5, as described above, the z-axis section 18c is defined by a plurality of modular construction units 28 that connect together in the x-y plane. The construction units 28 connect together one after the other with a chasing symmetry to form the z-axis section 18c. Specifically, FIG. 5 illustrates four construction units 28 that are arranged sequentially one after the other in a ring. The free end 44 of the wall segment 30 of each construction unit 28 faces the receiver socket 48 of an adjacent construction unit 28 in the sequence of the ring. In other words, the construction units 28 are arranged sequentially one after the other such that the receiver socket 48 of each construction unit 28 follows the free end 44 of the previous construction unit 28 within the sequence of the ring, and vice versa. The arrangement of the identical construction units 28 in the ring with the receiver sockets 48 following the free ends 44, and vice versa, defines the chasing symmetry of the construction units 28.

Figure 6:
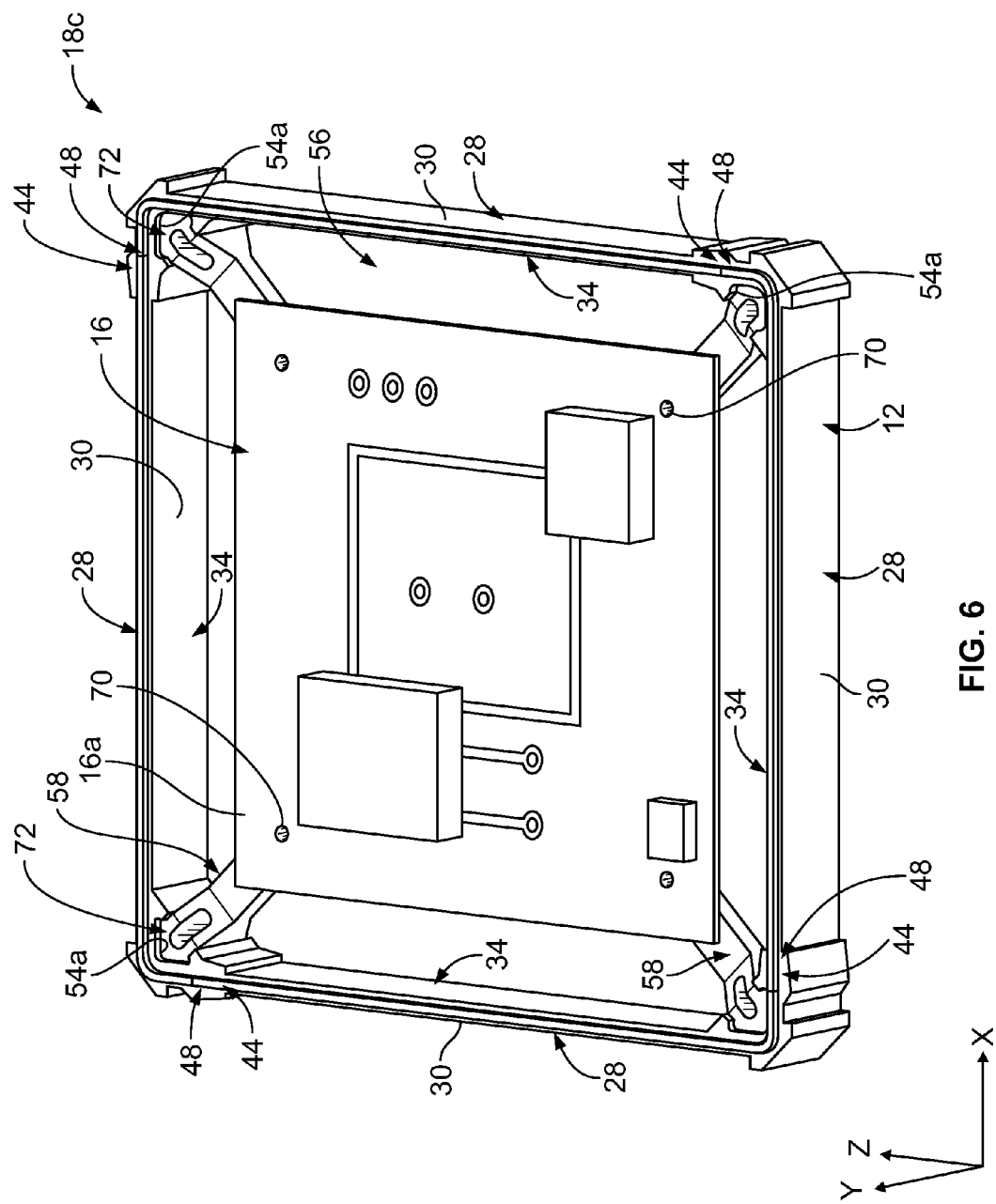
FIG. 6 is a perspective view of the z-axis section shown in FIG. 5 illustrating the z-axis section in an assembled state.

FIG. 6 is a perspective view of the z-axis section 18c illustrating the z-axis section 18c in an assembled state. As shown in FIG. 6, the free end 44 of each construction unit 28 is received within the receiver socket 48 of the corner segment 32 of the next construction unit 28 in the sequence of the ring such that the construction units 28 are mechanically connected together at the interface between the free end 44 and the receiver socket 48. The construction units 28 are thus connected together one after the other with the chasing symmetry to form a continuous ring that defines the z-axis section 18c. Although four are shown, any number of construction units 28 may be connected together to define the z-axis section 18c, which as will be described below may have any other shape than the square shape shown herein.

Reception of the free end 44 within the receiver socket 48 mechanically connects adjacent construction units 28 together. The free ends 44 are optionally received within the receiver sockets 48 with an interference and/or snap fit. For example, the interference and/or snap fit may be provided by a detent arrangement, a dimple/divot arrangement, a bar/groove arrangement, another arrangement, and/or the like. Whether or not the free ends 44 are received within the receiver sockets 48 with an interference and/or snap fit, one or more other structures and/or materials is optionally used to strengthen the mechanical connection at, and/or seal, the interface between the free ends 44 and the receiver sockets 48, such as, but not limited to, a weld, an adhesive, a fastener, a clip, a latch, a clamp, and/or the like. In some embodiments, the adhesive is an activatable adhesive system. Specifically, in some embodiments, the receiver sockets 48 are coated with an activatable adhesive before being assembled with other construction units 28, for example during fabrication of the construction unit 28. When an activatable adhesive system is used, the construction units 28 can be assembled dry, and later fused together as needed by activating the adhesive. The activatable adhesive system may be activated in any manner, such as, but not limited to, using heat, electrical current, radio waves, ultraviolet radiation, and/or the like.

As briefly described above, the length of the wall segment 30 of each construction unit 28 is trimmable to provide the z-axis section 18c with a pre-selected x-axis or y-axis dimension (depending on whether the length of the wall segment 30 extends along the x-axis or the y-axis). Accordingly, the x-axis and y-axis dimensions of the z-axis section 18c are scalable by trimming the wall segment 30 of each construction unit 28 to a pre-selected length that provides the z-axis section 18c with a pre-selected x-axis or y-axis dimension. The construction units 28 are modular units that can be connected together in any number to form a z-axis section 18c having any shape (with any number of sides), any x-axis dimension, and any y-axis dimension. In other words, the construction units 28 provide standard (i.e., universal) building blocks that can be connected together to build a z-axis section 18c of any size. The identical construction units 28 may be fabricated from the same mold or extrusion die, which may eliminate the need to provide different molds and/or dies for producing differently sized and/or shaped electronics enclosures. Moreover, by reducing the number of molds and/or dies required to produce a z-axis section 18, the identical construction units 28 may enable accelerated production of different electronics enclosures 10 by eliminating the time it takes to fabricate the additional molds and/or dies.

Optionally, an extension construction unit may be provided along one or more of the sidewalls 12 of the electronics enclosure 10. Specifically, the wall segment 30 of one or more of the one-piece construction blocks 28 may be effectively lengthened using a discrete extension construction unit that is connected within the ring of the z-axis section 18c between two construction units 28 that would be otherwise be adjacent within the ring. The extension one piece construction units are substantially similar to the construction units 28 except the extension construction units have an angle of approximately 0° between the receiver socket 48 and the wall segment 30 thereof such that the entirety of the length of the extension one piece construction unit is approximately straight. The extension construction units extend the maximum x-axis and y-axis dimensions to which the z-axis section 18c, and thus the electronics enclosure 10, is capable of being built. Moreover, the strengthening bosses 60 of corresponding extension construction units of a plurality of stacked z-axis sections 18 will add rigidity and/or strength to such larger enclosures 10 by forming a reinforcing rib that extends along the z-axis. The extension construction units may also be used with the z-axis sections 18a and 18b that are formed from the construction units 128.

Figure 7:
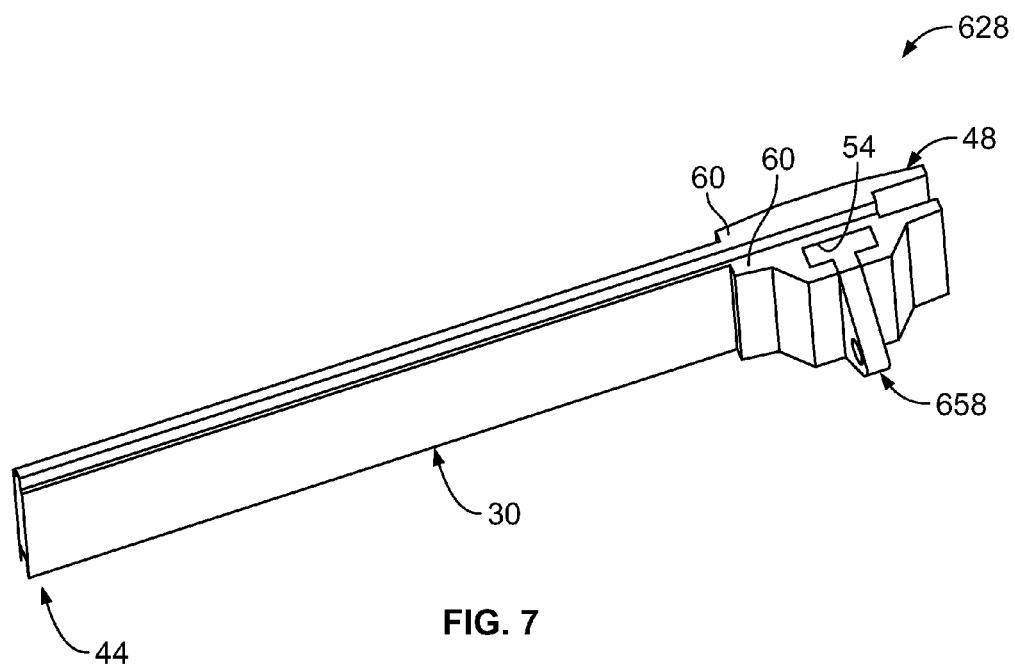
FIG. 7 is a perspective view of an exemplary embodiment of a modular extension construction unit.

For example, FIG. 7 is a perspective view of an exemplary embodiment of a modular extension construction unit 628. The extension construction unit 628 includes a receiver socket 48 and a wall segment 30. The wall segment 30 of the extension construction unit 628 has a free end 44 that is configured to be received within the receiver socket 48 of a construction unit 28 or 128. The receiver socket 48 of the extension construction unit 628 is configured to receive the free end 44 of the wall segment 30 of a construction unit 28 or 128. As shown in FIG. 7, the wall segment 30 and the receiver socket 48 of the extension construction unit 628 have an angle of approximately 0° relative to each other such that the entirety of the length of the extension one piece construction unit 628 is approximately straight. The receiver socket 48 of the construction unit 628 optionally includes one or more of the internal mounting features 54 for mounting one or more electronic and/or other devices 16 (FIGS. 6 and 10) to the extension construction unit 628. An exemplary embodiment of a mounting bracket 658 is connected to the mounting feature 54 for supporting the electronic and/or other device(s) 16. Moreover, the receiver socket 48 of the extension construction unit 628 includes a strengthening boss 60 that may add rigidity and/or strength to the enclosure 10 by forming a reinforcing rib that extends along the z-axis.

Referring again to FIG. 6, the continuous ring formed by the interconnected construction units 28 defines the internal cavity 56 of the z-axis section 18*c*. The internal cavity 56 is bounded by the internal sides 34 of the construction units 28. When the electronics enclosure 10 only includes a single z-axis section 18 (e.g., includes the z-axis section 18*c* but does not include any other z-axis sections 18), the internal cavity 56 defines the internal compartment 14 of the electronics enclosure 10. When the electronics enclosure includes a plurality of z-axis sections 18 (e.g., the z-axis sections 18*a*, 18*b*, and 18*c*) stacked together, the internal cavity 56 of each z-axis section 18 defines a corresponding portion of the internal compartment 14 of the electronics enclosure 10.

The z-axis section 18*c* holds one or more electronic devices 16. In the exemplary embodiment of the z-axis section 18*c*, the electronic device 16 is a circuit board 16*a* that includes a plurality of electrical components (e.g., traces, contacts, processors, integrated circuits, modules, packages, and/or the like). But, as described above, the electronic device 16*a* may be any other type of electronic device. The electronic device 16*a* includes a plurality of mounting brackets 58 that are mechanically connected thereto using openings 70 and fasteners (not shown) that extend within the openings 70. Alternatively, the mounting brackets 58 are integrally formed with the electronic device 16*a* or are mechanically connected to the electronic device 16*a* in a different manner and/or using different structure than the openings 70 and fasteners.

The key 72 of each mounting bracket 58 is received within the groove 54*a* of a corresponding one of the construction units 28 to mechanically connect the electronic device 16*a* to the construction units 28 and thereby hold the electronic device 16*a* within the internal cavity 56 of the z-axis section 18*c*. The keys 72 are optionally received within the grooves 54*a* with an interference and/or snap fit to securely connect the mounting brackets 58 to the construction units 28. Whether or not the keys 72 are received within the grooves 54*a* with an interference and/or snap fit, one or more other structures and/or materials is optionally used to strengthen the mechanical connection at, and/or seal, the interface between the keys 72 and the grooves 54*a*, such as, but not limited to, a weld, an adhesive, a fastener, a clip, a latch, a clamp, and/or the like. In some embodiments, the adhesive is an activatable adhesive system.

Figure 8:
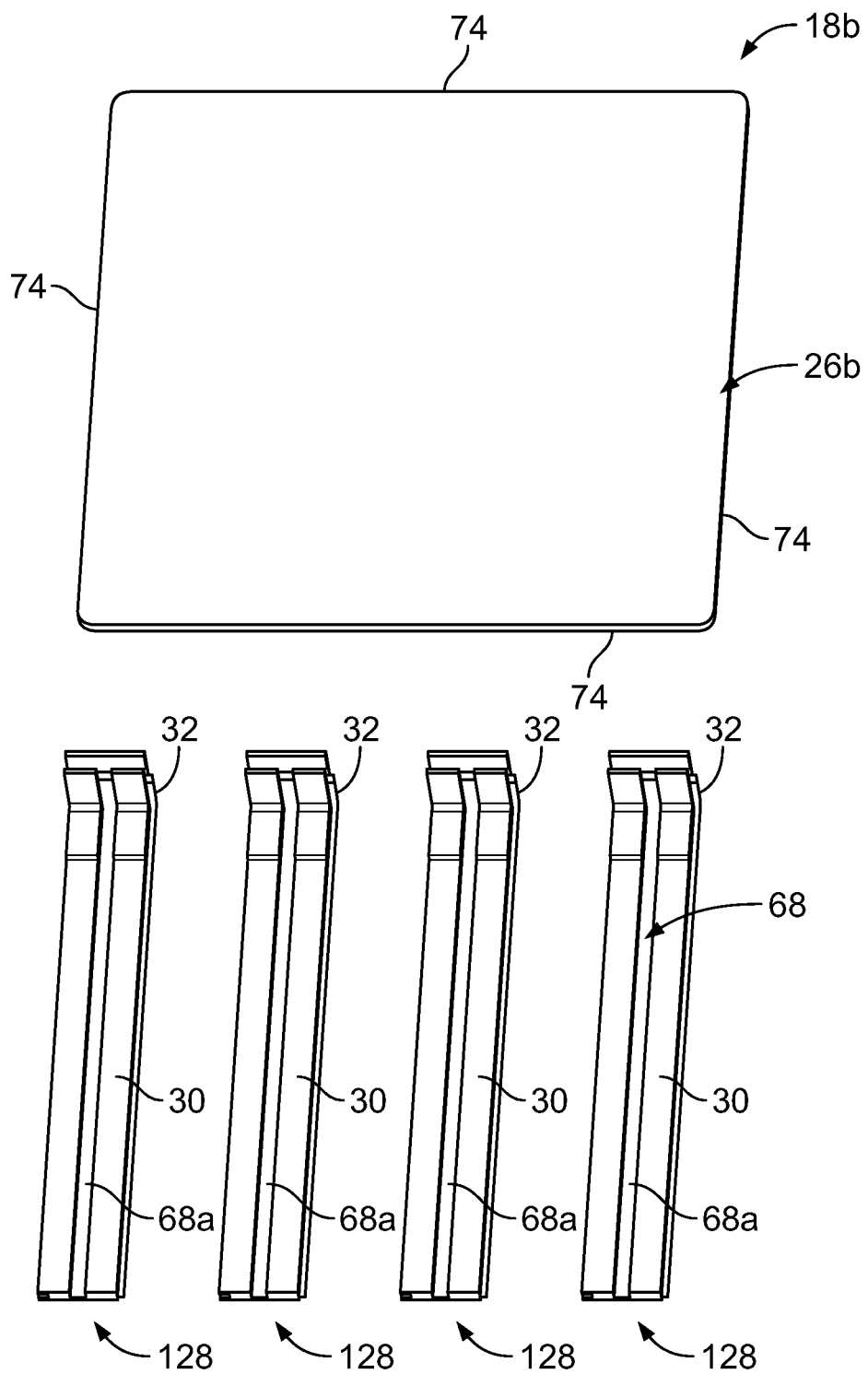
FIG. 8 is an exploded perspective view of an exemplary embodiment of another z-axis section of the enclosure shown in FIG. 1.

FIG. 8 is an exploded perspective view of an exemplary embodiment of the z-axis section 18*b* of the electronics enclosure 10. As shown in FIG. 1, the z-axis section 18*b* is an end z-axis section 18 within the stack 20 that includes the cover 26*b* and defines the end 24 of the electronics enclosure 10. The z-axis section 18*b* is defined by the cover 26*b* and a plurality of modular construction units 128 that connect together in the x-y plane. The identical construction units 128 connect together one after the other with a chasing symmetry to form the z-axis section 18*b*. The cover 26*b* extends between a plurality of edges 74. The construction units 128 include the wall segments 30 and the corner segments 32. The construction units 128 also include the cover mounting features 68 for incorporating the cover 26*b* into the z-axis section 18*b*. Specifically, in the exemplary embodiment of the construction units 128, the construction units 128 include the slots 68*a*.

Figure 9:
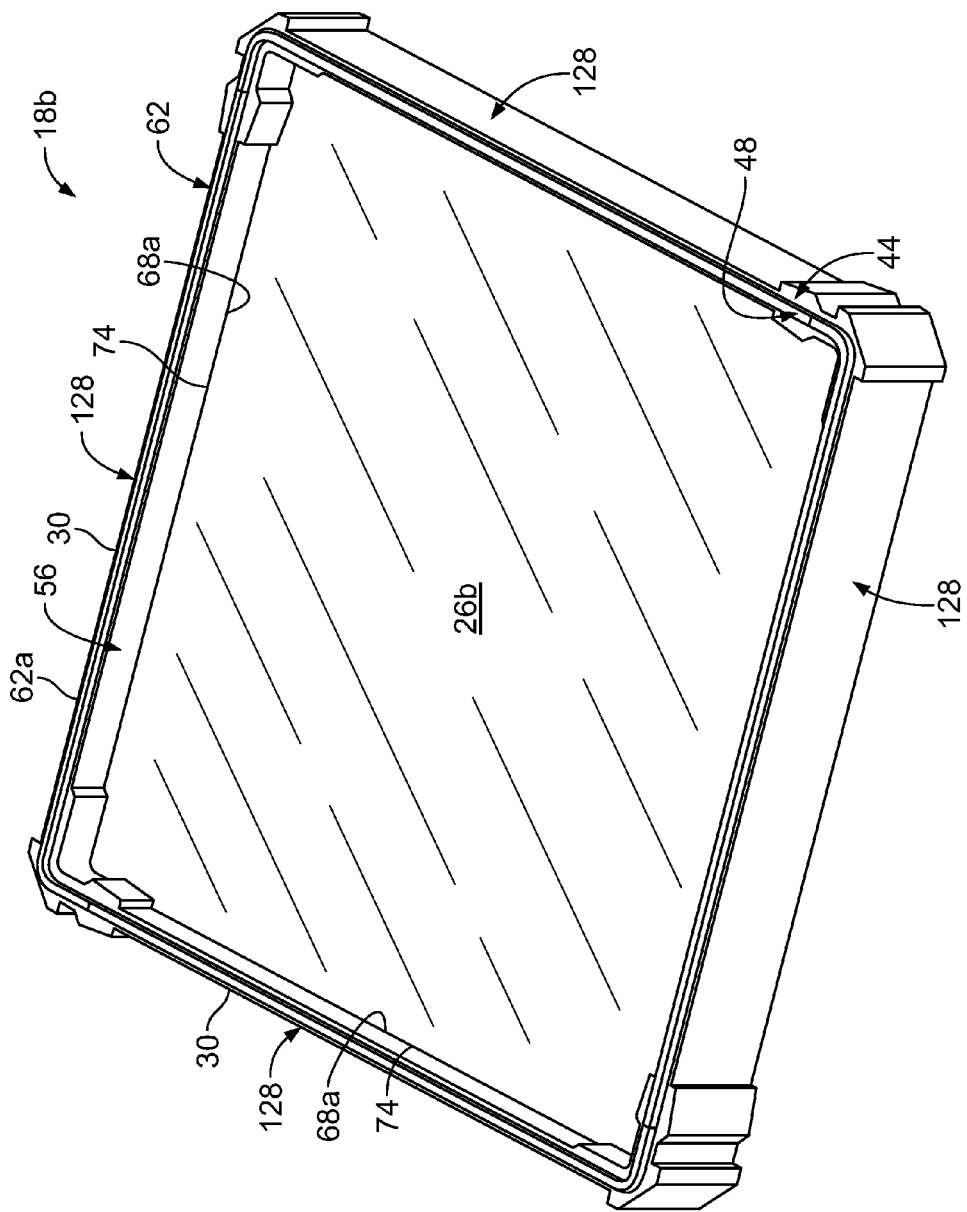
FIG. 9 is a perspective view of the z-axis section shown in FIG. 8 illustrating the z-axis section in an assembled state.

FIG. 9 is a perspective view of the z-axis section 18*b* illustrating the z-axis section 18*b* in an assembled state. As shown in FIG. 9, the construction units 128 are connected together one after the other with the chasing symmetry to form a continuous ring that defines the z-axis section 18*b*. Specifically, the free end 44 of the wall segment 30 of each construction unit 128 is received within the receiver socket 48 of the corner segment 32 of the next construction unit 128 in the sequence of the ring such that the construction units 128 are mechanically connected together at the interfaces between the free end 44 and the receiver socket 48. The continuous ring formed by the interconnected construction units 128 defines the internal cavity 56 of the z-axis section 18*b*. Although four are shown, any number of construction units 128 may be connected together to define the z-axis section 18*b*, which as will be described below may have any other shape than the square shape shown herein.

The free ends 44 of the construction units 128 are optionally received within the receiver sockets 48 with an interference and/or snap fit. Whether or not the free ends 44 are received within the receiver sockets 48 with an interference and/or snap fit, one or more other structures and/or materials is optionally used to strengthen the mechanical connection at, and/or seal, the interface between the free ends 44 and the receiver sockets 48, such as, but not limited to, a weld, an adhesive, a fastener, a clip, a latch, a clamp, and/or the like. In some embodiments, the adhesive is an activatable adhesive system. When an activatable adhesive system is used, the construction units 128 can be assembled dry, and later fused together as needed by activating the adhesive.

As is also shown in FIG. 9, the cover 26*b* is positioned within the internal cavity 56 of the z-axis section 18*b*. Each edge 74 of the cover 26*b* is received within the slot 68*a* of the corresponding construction unit 128 such that the cover 26*b* is mechanically connected to the construction units 128. The cover 26*b* is thus held within the internal cavity 56 of the z-axis section 18*b*. The edges 74 of the cover 26*b* are optionally received within the corresponding slots 68*a* with an interference and/or snap fit. Whether or not the edges 74 are received within the slots 68*a* with an interference and/or snap fit, one or more other structures and/or materials is optionally used to strengthen the mechanical connection at, and/or seal, the interface between the edges 74 and the slots 68*a*, such as, but not limited to, a weld, an adhesive, a fastener, a clip, a latch, a clamp, and/or the like. In some embodiments, the adhesive is an activatable adhesive system.

In the exemplary embodiment of the z-axis section 18*b*, the cover 26*b* is held along the z-axis at approximately a midpoint of the height of the z-axis section 18*b*. But, the cover 26*b* may be held at any other position along the height of the z-axis section 18*b*.

The construction units 128 of the z-axis section 18*b* include the inner tongue 62*a* of the stacking feature 62 for interconnection with the groove 64*a* (FIGS. 2, 3, and 10) of the construction units 28 (FIGS. 1-3, 5, 6 and 10) of the z-axis section 18*c* (FIGS. 1, 5, 6, and 10).

The length of the wall segment 30 of each construction unit 128, as well as the x-axis and y-axis dimensions of the cover 26*b*, are trimmable to provide the z-axis section 18*c* with pre-selected x-axis and y-axis dimensions. Accordingly, the x-axis and y-axis dimensions of the z-axis section 18*b* are scalable by trimming the wall segment 30 of each construction unit 128 to a pre-selected length, and by trimming the cover 26*b* to pre-selected x-axis and y-axis dimensions, that provide the z-axis section 18*b* with pre-selected x-axis and y-axis dimensions. The construction units 128 are modular units that can be connected together in any number to form a z-axis section 18*b* having any shape (with any number of sides), any x-axis dimension, and any y-axis dimension. In other words, the construction units 128 provide standard (i.e., universal) building blocks that can be connected together to build a z-axis section 18*b* of any size. The identical construction units 128 may be fabricated from the same mold or extrusion die, which may eliminate the need to provide different molds and/or dies for producing differently sized and/or shaped electronics enclosures. Moreover, by reducing the number of molds and/or dies required to produce a z-axis section 18, the identical construction units 128 may enable accelerated production of different electronics enclosures 10 by eliminating the time it takes to fabricate the additional molds and/or dies.

FIG. 10 is an exploded perspective view of the electronics enclosure 10. Referring now to FIGS. 1 and 10, the electronics enclosure 10 is formed by one or more z-axis sections 18. When the electronics enclosure 10 includes more than one z-axis section 18, the electronics enclosure 10 is formed by stacking two or more z-axis sections 18 on top of each other along the z-axis. The internal cavity 56 of each z-axis section 18 defines a corresponding portion of the internal compartment 14 of the electronics enclosure 10 such that the internal compartment 14 includes (i.e., is defined by) the internal cavities 56 of each z-axis section 18 within the stack 20.

The z-axis dimension of the electronics enclosure 10 may be pre-selected by selecting the number of z-axis sections 18 that make up the stack 20. In the exemplary embodiment of the electronics enclosure 10, the stack 20 of z-axis sections 18 of the electronics enclosure 10 includes the three z-axis sections 18*a*, 18*b*, and 18*c*. But, any number of z-axis sections 18 may be stacked to build the electronics enclosure 10. Accordingly, the z-axis dimension of the electronics enclosure 10 is scalable by selecting the number of z-axis sections 18 that are stacked on top of each other. In other words, the z-axis sections 18 are modular sections that provide standard (i.e., universal) building blocks that can be stacked together in any number to build an electronics enclosure 10 having any z-axis dimension.

Referring now solely to FIG. 10, within the stack 20, the tongues 62*a* of the construction units 128 of the z-axis section 18*b* are interlocked with the grooves 64*a* of the construction units 28 of the z-axis section 18*c* to mechanically connect and thereby interlock the z-axis sections 18*b* and 18*c*. Similarly, the tongues 62*a* of the construction units 28 of the z-axis section 18*c* are interlocked with the grooves 64*a* of the construction units 28 of the z-axis section 18*a* to mechanically connect and thereby interlock the z-axis sections 18*b* and 18*a*. The tongues 62*a* and grooves 64*a* of adjacent z-axis sections 18 within the stack 20 optionally interlock with an interference and/or snap fit. For example, the interference and/or snap fit may be provided by a detent arrangement, a dimple/divot arrangement, a bar/groove arrangement, another arrangement, and/or the like. Whether or not the tongues 62*a* and the grooves 64*a* interlock with an interference and/or snap fit, one or more other structures and/or materials is optionally used to strengthen the mechanical connection at, and/or seal, the interlock between corresponding tongues 62*a* and grooves 64*a*, such as, but not limited to, a weld, an adhesive, a fastener, a clip, a latch, a clamp, and/or the like. In some embodiments, the adhesive is an activatable adhesive system. Specifically, in some embodiments, the tongues 62*a* and grooves 64*a* of a z-axis section 18 are coated with an activatable adhesive before being stacked with other z-axis sections 18, for example during fabrication of the construction units 28 and/or 128. When an activatable adhesive system is used, the z-axis sections 18 of an electronics enclosure can be stacked dry, and later fused together as needed by activating the adhesive.

Optionally, an electromagnetic interference (EMI) gasket (not shown) is incorporated into the interlocking stacking features 62 and 64 of the z-axis sections 18 to facilitate containing EMI within the internal compartment of the electronics enclosure 10 and/or to facilitate shielding the electronic device(s) 16 within the internal compartment 14 from EMI originating outside of the electronics enclosure 10. In such embodiments wherein an EMI gasket is incorporated into the interlocking stacking features 62 and 64, any adhesive used with the mechanical connection between the construction units 28 or 128 of a z-axis section 18 may be provided as electrically conductive to form an integral EMI shield with the EMI gasket.

In the exemplary embodiment of the electronics enclosure 10, the stack 20 consists of a single interior z-axis section 18*c* and two end z-axis sections 18*a* and 18*b* that define the respective ends 22 and 24 of the electronics enclosure 10. But, the stack 20 of z-axis sections 18 of the electronics enclosure 10 may include any number of interior z-axis sections 18 that are positioned within the stack 20 between the end z-axis sections 18 that define the opposite ends 22 and 24 of the stack 20. Moreover, in the exemplary embodiment of the electronics enclosure 10, the interior z-axis section 18*c* holds the electronic device 16*a*, while the end z-axis sections 18*a* and 18*b* include the respective covers 26*a* and 26*b* that provide z-axis boundaries at the ends 22 and 24, respectively, of the electronics enclosure 10. In other words, the exemplary embodiment of the electronics enclosure 10 includes two z-axis sections 18*a* and 18*b* that include covers 26 and a single z-axis section 18*c* that holds one or more electronic devices 16. But, any other number of z-axis sections 18 of the electronics enclosure 10 may hold one or more electronic devices 16, and any other number of z-axis sections 18 of the electronics enclosure 10 may include a cover 26. In some embodiments, a particular electronic device 16 is held by two adjacent z-axis section 18 within the stack 20. For example, the keys 72 of the mounting brackets 58 of the particular electronic device 16 may be received within the grooves 54*a* of two adjacent z-axis sections 18 within the stack 20.

The z-axis sections 18 that hold electronic devices 16 are not limited to being interior z-axis sections 18 within the stack 20. Rather, a z-axis section 18 that holds one or more electronic devices 16 may be an end z-axis section 18 that defines the end 22 or 24 of the electronics enclosure 10. Moreover, the z-axis sections 18 that include covers 26 are not limited to being an end z-axis sections 18 that provides a z-axis boundary of the internal compartment 14 at the end 22 or 24 of the electronics enclosure 10. Rather, the stack 20 of z-axis sections 18 of the electronics enclosure 10 may include an interior z-axis section 18 that includes a cover 26. In such embodiments, the cover 26 of the interior z-axis section 18 may provide a divider within the internal compartment 14 that separates the internal cavities 56 of other z-axis sections 18 within the stack 20. In such embodiments wherein the stack 20 includes an interior z-axis section 18 having a cover 26, the cover 26 is optionally electrically conductive and supplied with electrical current such that the cover 26 provides a radio frequency (RF) shield (e.g., an EMI barrier) between the internal cavities 56 of adjacent z-axis sections 18 within the stack 20. For example, the RF shield may extend between electrical devices 16 that are held by different z-axis sections 18 within the stack 20. In such embodiments wherein a cover 26 provides an RF shield, the cover 26 may include any type of feed-through (e.g., an opening, a conduit, a fixture, and/or the like), connector, and/or the like for providing, through the cover 26, an electrical connection between the z-axis sections 18 that are isolated by the cover 26.

In the exemplary embodiment of the electronics enclosure 10, each of the z-axis sections 18 either includes a cover 26 or holds an electronic device 16. But, in other embodiments, one or more z-axis sections 18 of the electronics enclosure does not include a cover 26 and does not hold any electronic devices 16. For example, the internal cavity 56 of one or more z-axis sections 18 within the stack 20 may provide an open space (i.e., volume) that extends between the internal cavities 56, and thus the covers 26 and/or electronic devices 16, of other z-axis sections 18 within the stack 20. Moreover, and for example, the internal cavity 56 of one or more end z-axis sections 18 may not include a cover 26 or hold an electronic device 16, such that the internal compartment 14 of the electronics enclosure is open at the end 22 and/or 24. Further, the internal cavity 56 of one or more end z-axis sections 18 may hold one or more electronic devices 16 but no cover 26 such that the end 22 and/or 24 of the electronics enclosure 10 is defined by a z-axis section 18 that holds an electronic device 16 instead of a z-axis section 18 that includes a cover 26.

As discussed above, the stack 20 of the electronics enclosure 10 include any number of z-axis sections 18. Each z-axis section 18 may hold any number of electronic devices 16 and/or any number of covers 26. Moreover, the electronics enclosure 10 may include any number of electronic devices 16 overall and any number of covers 26 overall.

Referring again to FIG. 1, the z-axis sections 18 may be held (e.g., compressed) together in the stack 20 using any structure, means, and/or the like, such as, but not limited to, using a threaded fastener (e.g., a threaded rod), a strap, a clip, a band, a tie-down, a support rail, a support foot, a threaded rod, any of the connections between corresponding stacking features 62 and 64 described herein (e.g., snap-fits, interference fits, adhesive, and/or the like), and/or the like. For example, in some embodiments, a threaded rod (not shown) extends through openings (not shown) of the z-axis sections 18 (e.g., at one or more corners 76 of the enclosure 10, through one or more corner segments 32, through the electronic devices 16 of the z-axis sections 18, through the covers 26, and/or the like) to compress the z-axis sections 18 together and thereby hold the z-axis sections 18 together in the stack 20 (e.g., using a threaded nut and/or threads of the openings of the z-axis sections 18 to tighten the threaded rod). Another example includes using a support rail (e.g., the support rails 373 shown in FIG. 15) and/or support foot (e.g., the feet 469 shown in FIG. 16) that extends along the z-axis of the enclosure 10 and mounts to the z-axis sections 18 to hold the z-axis sections 18 together in the stack 20.

One or more of the sidewalls 12 of the electronics enclosure 10 optionally includes one or more ports (not shown) that extend through the corresponding sidewall 12 into the internal compartment 14. One or more ports may be used for thermal management, for example to vent heat from the internal compartment 14. In addition or alternatively, one or more ports may be used to pass one or more electrical conductors (not shown) through the corresponding sidewall 12, one or more ports may be used to mount an electrical and/or optical connector (not shown) to the corresponding sidewall 12, and/or one or more ports may be used to enable one or more other components to be mounted to and/or pass through the corresponding sidewall 12. Each port may extend through only one z-axis section 18 (e.g., through the wall segment 30 of a single corresponding construction unit 28 or 128 of a single z-axis section 18), or may be shared by two z-axis sections 18 (e.g., extending through interlocked wall segments 30 of adjacent z-axis sections 18 within the stack 20 such that the port bridges the adjacent z-axis sections 18). Providing a port that is shared by adjacent z-axis sections 18 may facilitate easing removal of the corresponding component that is mounted to and/or passes through the corresponding sidewall 12 for rework. Each port may be provided with a seal (not shown) and/or a sealing surface to seal the corresponding component that is mounted to and/or passes through the corresponding sidewall 12. When a port is shared by adjacent z-axis sections 18, the seal and/or the sealing surfaces of the adjacent z-axis sections 18 define a shared seal that is shared between the adjacent z-axis sections 18. In addition or alternatively to a seal, a reinforcing boss may be used to support the corresponding component that is mounted to and/or passes through the corresponding sidewall 12.

Each port may be formed during fabrication of the corresponding construction unit(s) 28 and/or 128, after fabrication of the corresponding construction unit(s) 28 and/or 128 but before the corresponding z-axis section(s) 18 is assembled, after the corresponding z-axis section(s) 18 has been assembled but before any of the z-axis sections 18 have been stacked together, after only some of the z-axis sections 18 have stacked together, or after all of the z-axis sections 18 have been stacked together to define the electronics enclosure 10. When formed after fabrication of the corresponding construction unit(s) 28 and/or 128, each port may be formed using any suitable cutting process, such as, but not limited to, drilling, machining, boring, using heat, using a laser, water cutting, and/or the like. In some embodiments, one or more of the ports is provided during fabrication of the corresponding construction unit(s) 28 and/or 128 as a cutout and/or knockout that can be cut out and/or knocked out, respectively, by a person and/or machine that is building the electronics enclosure 10, which may reduce the number of cutting operations performed by the person and/or machine building the electronics enclosure 10.

In the exemplary embodiment of the electronics enclosure 10, the electronics enclosure 10 has the overall shape of parallelepiped. The parallelepiped shape of the electronics enclosure 10 is defined by the square shapes of the z-axis sections 18. But, the overall shape of the electronics enclosure 10 is not limited to a parallelepiped shape, nor are the z-axis sections 18 limited to a square shape. Rather, the z-axis sections 18 may have any other shape in the x-y plane, such as, but not limited to, a circular shape, a different rectangular shape (e.g., a non-square shape), a triangular shape, a hexagonal shape, a curved shape, an oval shape, a multilateral shape, a parabola shape, a shape having more than four sides, an irregular shape, a non-uniform shape, a stepped shape, a non-symmetrical shape, and/or the like. Moreover, the electronics enclosure 10 may have any other overall shape, such as, but not limited to, a cylindrical shape (e.g., a circular cross-sectional shape in the x-y plane), a different parallelepiped shape, a triangular cross-sectional shape in the x-y plane, a curved cross-sectional shape in the x-y plane, an oval cross-sectional shape in the x-y plane, a hexagonal cross-sectional shape in the x-y plane, a multilateral shape, a parabola cross-sectional shape in the x-y plane, a shape having more than four sides, an irregular shape, a stepped shape, a non-uniform shape, a non-symmetrical shape, and/or the like.

For example, in the exemplary embodiment of the electronics enclosure 10, the z-axis sections 18 are defined by four construction units 28 or 128 that connect together in the x-y plane. The receiver sockets 48 of the construction units 28 or 128 of the z-axis sections 18 extend at angles of approximately 90° relative to the lengths of the wall segments 30. The four construction units 28 or 128 and the angles of approximately 90° provides each z-axis section 18 with four sides (i.e., a four-sided shape). But, the receiver socket 48 of each construction unit 28 and 128 may be angled at any angle relative to the length of the wall segment 30 of the construction unit 28 or 128, and each z-axis section 18 may include any number of construction units 28 or 128, that provides the z-axis section 18 with any shape having any number of sides. For example, the receiver socket 48 of each construction unit 28 and 128 may extend at an angle of between approximately 0° and approximately 180° relative to the length of the wall segment 30 of the construction unit 28 or 128. Moreover, and for example, in embodiments wherein the z-axis sections 18 have the shape of an equilateral triangle in the x-y plane, the receiver sockets 48 are angled at approximately 60° relative to the length of the corresponding wall segment 30. Another example has receiver sockets 48 that are angled at approximately 120° relative to the length of the corresponding wall segment 30, for example in embodiments wherein the z-axis sections 18 have a hexagonal shape in the x-y plane. In some embodiments, construction units 28 and/or 128 that have different angles between the receiver socket 48 and the wall segment 30 thereof may be fabricated using the same mold and/or extrusion die by providing the mold and/or extrusion die with an insert that can be rotated, or otherwise moved, between a plurality of different positions that give different angles between the receiver socket 48 and the wall segment 30.

As discussed above, the construction units 28 may be fabricated from the same mold or extrusion die, which may eliminate the need to provide different molds and/or dies for producing differently sized and/or shaped electronics enclosures. Moreover, by reducing the number of molds and/or dies required to produce a z-axis section 18, the identical construction units 28 may enable accelerated production of different electronics enclosures 10 by eliminating the time it takes to fabricate the additional molds and/or dies.

In embodiments wherein the z-axis sections 18 include a curved shape in the x-y plane, the lengths of the wall segments 30 and/or the corner segments 32 of at least some of the construction units 28 and 128 extend along an at least partially curved path. Any curved portions of the construction units 28 and 128 may have any radius, which may or may not have a continuous value (e.g., circular z-axis sections 18 will have a continuous radius while oval-shaped z-axis sections 18 will have a variable radius). In embodiments wherein the z-axis sections 18 include a curved shape in the x-y plane, any construction units 28 and 128 having a wall segment 30 and/or a corner segment 32 that follows an at least partially curved path may be fabricated with the curved path or may be fabricated with an approximately straight path and thereafter bent to define the curved path. Moreover, the wall segment 30 and/or corner segment 32 may be bent after fabrication to change the radius of a curve formed during fabrication of the construction unit 28 or 128. For example, the construction unit 28 or 128 may be heated to enable the bend.

In the exemplary embodiment of the electronics enclosure 10, the z-axis sections 18 include convex exterior corners 76, as can be seen in FIG. 1. But, in some other embodiments, the z-axis sections 18 have a shape that includes both one or more convex exterior corners and one or more concave exterior corners, which may provide the z-axis section 18 with a relatively complex shape, such as, but not limited to, an irregular shape, a stepped shape, a non-symmetrical shape, a symmetrical shape, and/or the like. For example, the orientation of at least one construction unit 28 or 128 of a z-axis section 18 may be reversed relative to one or more other construction units 28 or 128 of the z-axis section 18 such that the internal side 34 faces outward away from the internal cavity 56 of the z-axis section 18 instead of inward toward the internal cavity 56. In other words, the internal side 34 of such as reversed orientation construction unit 28 or 128 will define an external side of the enclosure 10 and the external side 36 of such as reversed orientation construction unit 28 or 128 will define an internal side of the enclosure 10. Accordingly, a relatively complex shaped electronics enclosure can be built by combining concave exterior corners and convex exterior corners in any combination and number.

The construction units 28 and 128 may each be fabricated from any materials. In some embodiments, at least some of the construction units 28 and at least some of the construction units 128 are fabricated from one or more polymers. Moreover, at least some of the covers 26 are fabricated from one or more polymers in some embodiments. Fabricating at least some of the construction units 28 and 128 and/or at least some of the covers 26 from one or more polymers may reduce a weight of the electronics enclosure 10, for example as compared to at least some known electronics enclosures that are fabricated from other materials (e.g., metals and/or the like). The polymer(s) used to fabricate the construction units 28 and 128 and/or the covers 26 may be selected based on the weight thereof to provide the electronics enclosure with a predetermined weight and/or a predetermined weight savings.

Examples of polymers that may be used to fabricate the construction units 28 and 128 and/or the covers 26 include, but are not limited to, a plastic, a thermoplastic, a foam, an expanded material, polyimide, polyamide, polyester, polyphenylene sulfide (PPS), a natural polymeric material, natural rubber, cellulose, a synthetic polymer, synthetic rubber, phenol formaldehyde resin, neoprene, nylon, polyvinyl chloride (PVC), polystyrene, polyethylene, polypropylene, polyacrylonitrile, polyvinyl butyral (PVB), silicone, a shape memory polymer, a liquid crystal polymer (LCP), polyethersulfone (PES), and/or the like. Examples of plastics that the construction units 28 and 128 and/or the covers 26 may be fabricated from include, but are not limited to, a thermoplastic, a thermosetting polymer, an acrylic, a polyester, a silicone, a polyurethane (PU), a halogenated plastic, a condensation plastic, a polyaddition plastic, a cross-linked plastic, a polyethylene (PE), low-density PE (LDPE), high-density PE, a polypropylene (PP), a polyamide (i.e., nylon), a polystyrene (PS), high impact PS, polyvinyl chloride (PVC), polytetrafluoroethylene (PTFE), polyvinylidene chloride (PVDC), polyethylene terephthalate (PET), acrylonitrile butadiene styrene (ABS), PE/ABS, polycarbonate (PC), PC/ABS, polymethyl methacrylate (PMMA), urea-formaldehyde (UF), melamine formaldehyde (MF), a plastarch material, a phenolic (PF; also referred to as phenol formaldehydes), polyetheretherketone (PEEK), polyetherimide (PEI), polylactic acid (PLA), an elastomeric plastic, a synthetic plastic, a natural plastic, a bioplastic, a biodegradable plastic, a semi-crystalline plastic, a semi-amorphous plastic, a completely amorphous plastic, a natural rubber, a synthetic rubber, and/or the like.

In some embodiments, when a construction unit 28 or 128 is fabricated from one or more polymers, a majority, at least 90%, or an approximate entirety of the construction unit is fabricated from the polymer(s). Moreover, in some embodiments, when a cover 26 is fabricated from one or more polymers, a majority, at least 90%, or an approximate entirety of the cover 26 is fabricated from the polymer(s). One example of fabricating less than an approximate entirety of a construction unit 28 or 128 from one or more polymers includes adding one or more filler and/or reinforcement materials to the polymer(s) used to fabricate the construction unit 28 or 128. The filler and/or reinforcement materials may modify the chemical, mechanical, thermal, and/or electrical properties of the polymer(s) used to fabricate the construction unit 28 or 128. In embodiments wherein one or more polymers is used to fabricate a construction unit 28 or 128 and one or more filler and/or reinforcement materials is added to the polymer(s), the construction unit 28 or 128 may consist of any amount of the polymer(s), such as, but not limited to, at least approximately 50% of the construction unit 28 or 128 may consist of the polymer(s). Another example of fabricating less than an approximate entirety of a construction unit 28 or 128 includes providing the construction unit with a base material(s) that is coated (e.g., plated) with one or more different materials (whether or not the base material(s) includes one or more polymers, whether or not the coating includes one or more polymers, and/or whether or not one or more filler and/or reinforcement materials is added to the polymer(s)). In some embodiments, a construction unit 28 or 128 includes a body that is fabricated from one or more polymers and includes a hollow interior space that is filled with one or more polymer(s) and/or one or more other substances, such as, but not limited to, air, another gas, a vacuum, and/or the like (whether or not one or more filler and/or reinforcement materials is added to the polymer(s)). In such embodiments, a majority, at least 90%, or an approximate entirety of the body of the construction unit 28 or 128 may be fabricated from the polymer(s). Moreover, in such embodiments, the body of the construction unit 28 or 128 may have any thickness and may be filled with any amount of the polymer(s) and/or the other substance(s). Less than an approximate entirety of a cover 26 can be fabricated from the polymer(s) in a substantially similar fashion.

Optionally, two or more of the construction units 28 and/or 128 are fabricated from different materials to provide the construction units 28 and/or 128 with different physical properties, such as, but not limited to, thermal conductivity, electrically conductivity, optical transparency, electrical transparency, and/or the like. For example, one or more of the construction units 28 and/or 128 may be fabricated from a material (e.g., aluminum, copper, gold, silver, iron, steel, another metal, and/or the like) that is thermally conductive (e.g., a thermal conductivity greater than approximately 20 Watts per meter-degree K (W/m° K) such that the construction unit(s) is thermally conductive. In some embodiments, the material selected to provide one or more construction units 28 and/or 128 as thermally conductive has a thermal conductivity of greater than approximately 20 W/m° K, at least approximately 100 W/m° K, between approximately 100 W/m° K and approximately 400 W/m° K, or greater than approximately 400 W/m° K. Providing one or more construction units 28 and/or 128 that is thermally conductive enables the electronics enclosure 10 to provide thermal management to the electronic device 16 that are enclosed within the electronics enclosure 10. For example, one or more thermally conductive construction units 28 and/or 128 may be configured to act as a heat sink for dissipating heat from the electronic device(s) 16 enclosed within the electronics enclosure 10. Moreover, and for example, a heat sink (not shown) may be mounted to one or more thermally conductive construction units 28 and/or 128 such that the unit(s) 28 and/or 128 provide an intermediate structure that transfers heat from the electronic device(s) to the heat sink. In addition or alternatively to one or more of the construction units 28 and/or 128, one or more covers 26 may be fabricated from a material that is thermally conductive such that the cover(s) 26 is thermally conductive.

Another example of providing two or more of the construction units 28 and/or 128 with different physical properties includes fabricating one or more of the construction units 28 and/or 128 from a material (e.g., aluminum, copper, gold, silver, iron, steel, another metal, and/or the like) that is electrically conductive such that the construction unit(s) is configured to conduct electrical energy. Providing one or more construction units 28 and/or 128 that is electrically conductive enables the electronics enclosure 10 to provide electrical functions and/or electrical pathways to and from the electronic device(s) 16. For example, one or more electrically conductive construction units 28 and/or 128 may provide an electrical pathway to and from an electronic device 16 for supplying electrical power to the electronic device 16 and/or for receiving electrical power from the electronic device 16. Moreover, and for example, one or more electrically conductive construction units 28 and/or 128 may provide a pathway for connecting one or more electronic devices 16 to an electrical ground. Examples of one or more electrically conductive construction units 28 and/or 128 that provide electrical functions include, but are not limited to, functioning as an antenna and/or the like. In addition or alternatively to one or more of the construction units 28 and/or 128, one or more covers 26 may be fabricated from a material that is electrically conductive such that the cover(s) 26 is configured to conduct electrical energy.

In some embodiments, one or more of the construction units 28 and/or 128 is fabricated such that the construction unit 28 or 128 is optically transparent and/or electrically transparent. For example, an optically transparent construction unit 28 or 128 may be provided to enable one or more indicators (not shown; e.g., light emitting diodes (LEDs) and/or other lights, video displays, and/or the like) within the internal compartment 14 of the electronics enclosure 10 to be viewable from outside the internal compartment 14 (i.e., through the sidewalls 12 and/or other portions of the electronics enclosure 10). Another example of using an optically transparent construction unit 28 or 128 includes using the optical transparency to enable an infrared communications link (not shown) contained within the internal compartment 14 to send and receive infrared signals through the optically transparent construction unit 28 or 128. One example of using an electrically transparent construction unit 28 or 128 includes using the electrical transparency to enable an RF antenna (not shown) contained within the internal compartment 14 to send and receive RF signals through the electrically transparent construction unit 28 or 128. In addition or alternatively to one or more of the construction units 28 and/or 128, one or more covers 26 may be configured to be optically and/or electrically transparent.

Any number of the construction units 28 and/or 128 may be thermally conductive, electrically conductive, optically transparent, and/or electrically transparent. In some embodiments, a majority of the construction units 28 and 128 are fabricated from the polymer(s). In such embodiments, because only some of the construction units 28 and/or 128 are fabricated from materials (e.g., the metals described above) that are heavier than the polymer(s) used to fabricate the majority of the construction units 28 and 128, the electronics enclosure 10 may still have a reduced weight as compared to at least some known electronics enclosures. The number of construction units 28 and/or 128 that are fabricated from the heavier materials, as well as the particular polymeric and heavier materials used, may be selected to provide the electronics enclosure 10 with a predetermined weight and/or a predetermined weight savings.

Figure 11:
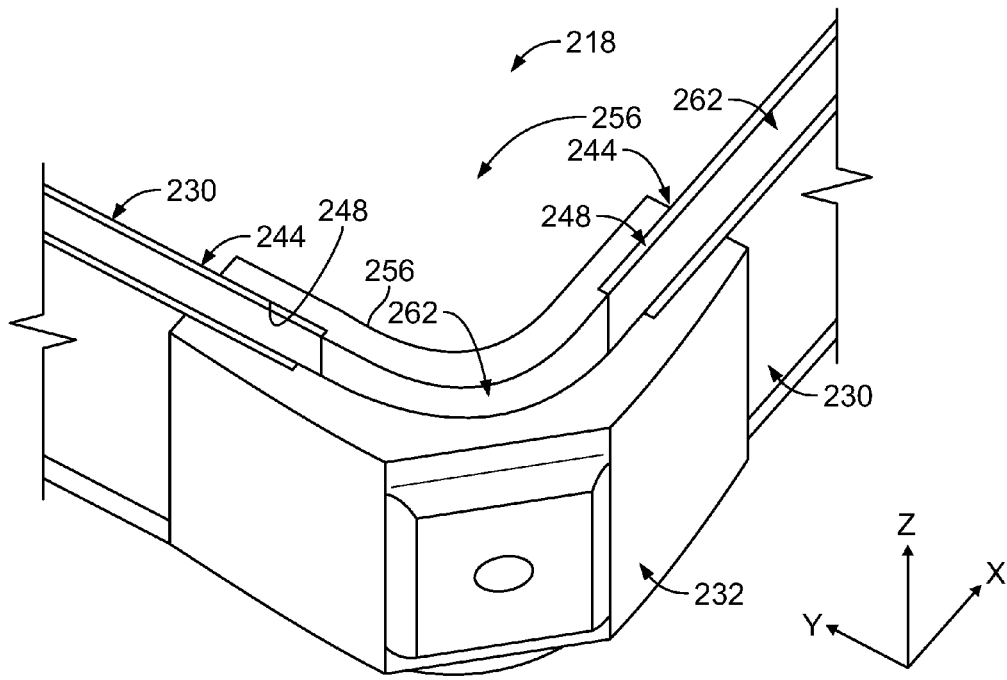
FIG. 11 is a perspective view of a portion of another exemplary embodiment of a z-axis section.
Figure 12:
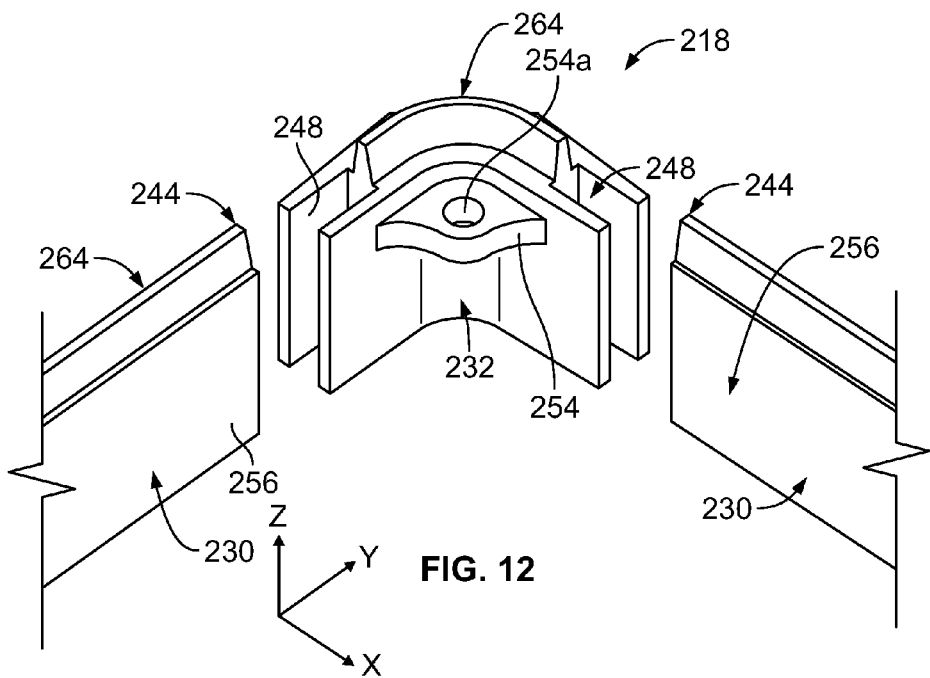
FIG. 12 is an exploded perspective view of the z-axis section shown in FIG. 11.

FIG. 11 is a perspective view of a portion of another exemplary embodiment of a z-axis section 218. FIG. 12 is an exploded perspective view of the z-axis section 218. In the exemplary embodiment, the z-axis section 218 is an interior z-axis section 218 that does not include a cover (not shown), but may hold an electronic device 16. Alternatively, the z-axis section 218 includes a cover. The z-axis section 218 is defined by a plurality of modular corner segments 232 and a plurality of modular wall segments 230 that connect together in the x-y plane to define an internal cavity 256 thereof. The corner segments 232 and the wall segments 230 connect together in an alternating arrangement to form the z-axis section 218. The z-axis section 218 can then be used alone or arranged within a stack with other z-axis sections 218 to build an electronics enclosure (not shown), wherein the internal cavity 256 of the z-axis section 218 defines at least a portion of an internal compartment (not shown) of the electronics enclosure. The internal compartment of the electronics enclosure at least partially formed by the z-axis section 218 is configured to receive an electronic device 16 (not shown with respect to the z-axis section 218). The z-axis section 218 may be referred to herein as a "first", a "second", and/or a "third" z-axis section. Moreover, the z-axis section 218 may be referred to herein as an "additional" z-axis section.

Each wall segment 230 extends a length between opposite free ends 244. Only one free end 244 of each wall segment 230 is visible in FIGS. 11 and 12. Each corner segment 232 includes opposite receiver sockets 248 that are each configured to receive a corresponding free end 244 of a corresponding wall segment 230 therein in a substantially similar manner to that described above with respect to the construction units 28 (FIGS. 1-3, 5, 6 and 10) and 128 (FIGS. 1, 4, and 8-10). In the exemplary embodiment of the z-axis section 218, the receiver sockets 248 of each corner segment 232 extend at an angle of approximately 90° relative to each other and the z-axis section 218 has a four-sided shape. But, the receiver sockets 248 of each corner segment 232 may be angled at any angle relative to each other to provide the z-axis section 218 with any shape having any number of sides. For example, the receiver sockets 248 of each corner segment 232 may extend at an angle of between approximately 0° and approximately 180° relative to each other. Each wall segment 230 may be referred to herein as a "first" and/or a "second" wall segment. Each corner segment 232 may be referred to herein as a "first" and/or a "second" corner segment. Each receiver socket 248 may be referred to herein as a "first" and/or a "second" receiver socket.

The lengths of the wall segments 230 are trimmable to provide the z-axis section 218 with pre-selected x-axis and y-axis dimensions. Accordingly, the x-axis and y-axis dimensions of the z-axis section 218 are scalable by trimming the wall segments 230 to a pre-selected length that provides the z-axis section 218 with a pre-selected x-axis or y-axis dimension. The corner segments 232 and the wall segments 230 are modular units that can be connected together in any number to form a z-axis section 218 having any shape (with any number of sides), any x-axis dimension, and any y-axis dimension. In other words, the corner segments 232 and the wall segments 230 provide standard (i.e., universal) building blocks that can be connected together to build a z-axis section 218 of any size. The identical corner segments 232 may be fabricated from the same mold or extrusion die, which may eliminate the need to provide different molds and/or dies for producing differently sized and/or shaped electronics enclosures. Similarly, the identical wall segments 230 may be fabricated from the same mold or extrusion die, which may eliminate the need to provide different molds and/or dies for producing differently sized and/or shaped electronics enclosures. Moreover, by reducing the number of molds and/or dies required to produce a z-axis section 218, production of different electronics enclosures may be accelerated by eliminating the time it takes to fabricate the additional molds and/or dies.

The corner segments 232 and the wall segments 230 may each be fabricated from any materials. In some embodiments, at least some of the corner segments 232 and at least some of the wall segments 230 are fabricated from one or more polymers. Fabricating at least some of the corner segments 232 and/or at least some of the wall segments 230 from one or more polymers may reduce a weight of the electronics enclosure, for example as compared to at least some known electronics enclosures that are fabricated from other materials (e.g., metals and/or the like). The polymer(s) used to fabricate the corner segments 232 and the wall segments 230 may be selected based on the weight thereof to provide the electronics enclosure with a predetermined weight and/or a predetermined weight savings. In some embodiments, a majority of the corner segments 232 and/or a majority of the wall segments 230 of the z-axis section 218 and/or of an electronics enclosure that includes the z-axis section 218 are fabricated from the polymer(s).

In some embodiments, when a corner segment 232 is fabricated from one or more polymers, a majority, at least 90%, or an approximate entirety of the corner segment 232 is fabricated from the polymer(s). Moreover, in some embodiments, when a wall segment 230 is fabricated from one or more polymers, a majority, at least 90%, or an approximate entirety of the wall segment 230 is fabricated from the polymer(s). Optionally, wall segments 230 and/or corner segments 232 are fabricated from different materials to provide different physical properties, such as, but not limited to, thermal conductivity, electrically conductivity, optical transparency, electrical transparency, and/or the like.

The wall segments 230 and/or the corner segments 232 includes one or more stacking features 262 (best seen in FIG. 11) for stacking the z-axis section 218 on another z-axis section 218. The wall segments 230 and/or the corner segments 232 also include one or more stacking features 264 (best seen in FIG. 12) for stacking another z-axis section 218 on the z-axis section 218. The stacking features 262 and 264 enable z-axis sections 218 to be stacked and mechanically connected together within the stack. Specifically, the stacking features 262 and 264 of adjacent z-axis sections 218 within the stack interlock with each other. In the exemplary embodiment of z-axis section 218, the stacking features 264 and 262 are tongue and groove joints, respectively. But, in addition or alternatively to the tongue and groove joints, the stacking features 262 and 264 may include any other structure that enables z-axis sections 218 to be stacked, such as, but not limited to, a lap joint, and/or the like.

Referring now solely to FIG. 12, the corner segments 232 include one or more internal mounting features 254 for mounting one or more electronic devices 16 (FIGS. 6 and 10)

thereto. The mounting feature 254 may be used in combination with the mounting features 254 of other corner segments 232 of the same z-axis section 218 to hold the electronic device(s) 16 within the internal cavity 256 of the z-axis section 218. The internal mounting feature 54 extends on the internal side 34 of the construction unit 28. In the exemplary embodiment of the construction unit 28, the internal mounting feature 54 is an opening 254a that receives a fastener therein. But, in addition or alternatively to the opening 254a, the internal mounting feature 254 may include any other structure that enables the corner segment 232 to be mechanically connected to the electronic device 16, such as, but not limited to, a groove, keying feature, a slot, a clip, a latch, a clamp, a different interference-fit member, a snap-fit member, and/or the like. Moreover, in addition or alternatively to the internal mounting feature 254 on the corner segment 232, one or more wall segments 230 may include one or more internal mounting features 254. A common spider assembly (not shown) is optionally provided to increase the rigidity of an electronics enclosure that includes the z-axis section 218. The spider assembly may include framework (e.g., a web of framework) that reinforces the corner segments 32 of the z-axis sections 18.

Figure 13:
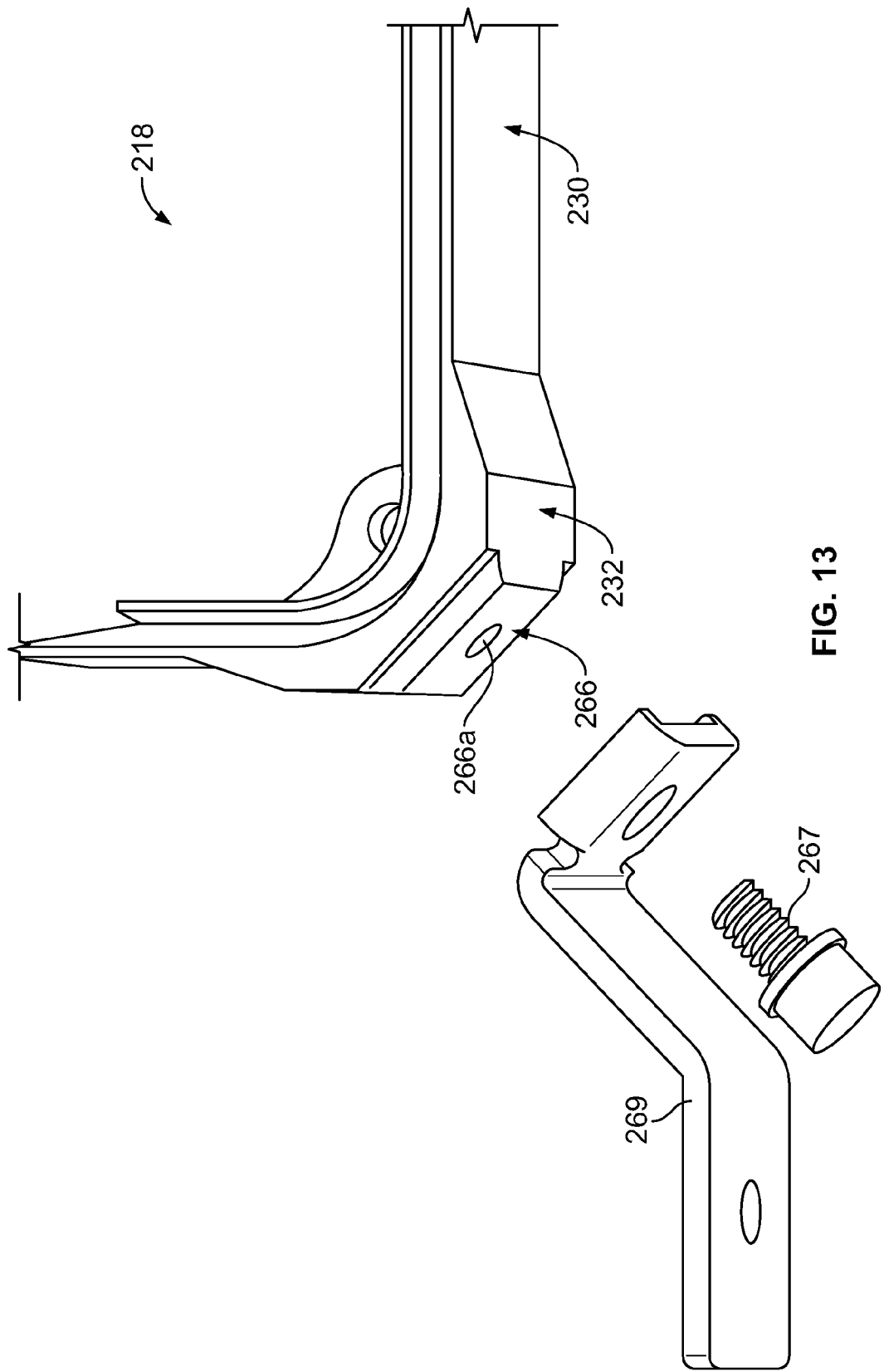
FIG. 13 is a perspective view of a portion of the z-axis section shown in FIGS. 11 and 12 illustrating an exemplary embodiment of an external mounting feature of the z-axis section.

FIG. 13 is a perspective view of a portion of the z-axis section 218 illustrating an exemplary embodiment of an external mounting feature 266 of the z-axis section 218. The external mounting feature 266 enables the mounting of one or more support structures to the electronics enclosure of the z-axis section 218, for example to facilitate supporting, mounting, compression, and/or the like of the electronics enclosure. In the exemplary embodiment of the z-axis section 218, the external mounting feature 266 includes an opening 266a that is configured to receive a fastener 267 for mounting an angled foot 269 to the z-axis section 218. Although one is shown, the z-axis section 218 may include any number of the openings 266a for receiving any number of fasteners. In addition or alternatively to the opening 266a, the external mounting feature 266 may include any other structure that enables the support structure to be mounted to the z-axis section 218, such as, but not limited to, a groove, a slot, a keying feature, a clip, a latch, an interference-fit member, a snap-fit member, and/or the like. Moreover, in addition or alternatively to the external mounting feature 266 on the corner segment 232, the z-axis section 218 may include one or more external mounting features 266 positioned at another location, for example along a wall segment 230.

Figure 14:
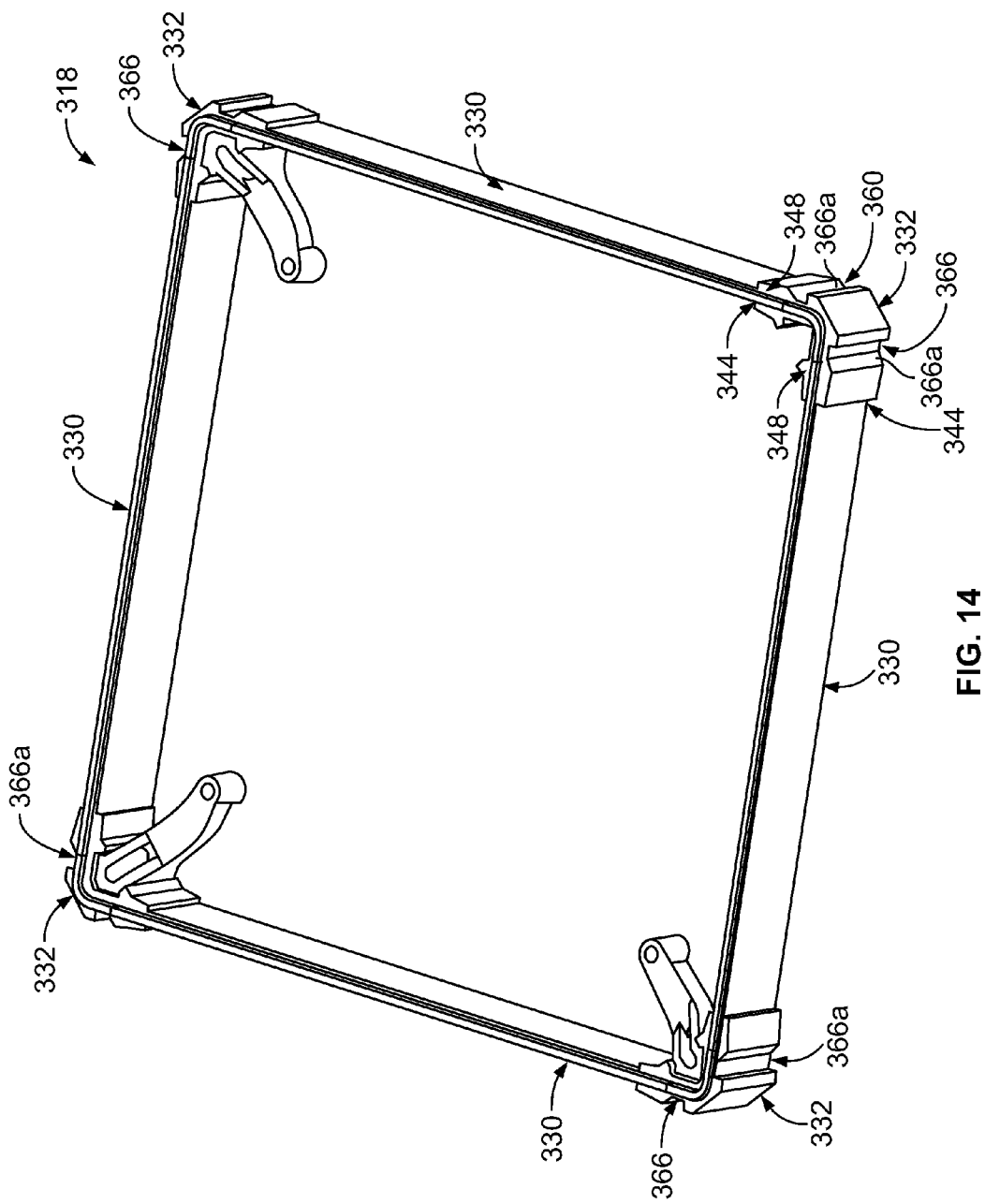
FIG. 14 is a perspective view of yet another exemplary embodiment of a z-axis section.

Referring again to FIGS. 11 and 12, the corner segments 232 and the wall segments 230 connect together in an alternating arrangement to form the z-axis section 218. The z-axis section 218 can then be used alone or arranged within a stack with other z-axis sections 218 to build the corresponding electronics enclosure. For example, FIG. 14 is a perspective view of yet another exemplary embodiment of a z-axis section 318. The z-axis section 318 is defined by a plurality of modular corner segments 332 and a plurality of modular wall segments 330 that connect together in an alternating arrangement to form the z-axis section 318. Specifically, free ends 344 of the wall segments 330 are received within the corresponding receiver socket 348 of the corresponding corner segment 332 such that the corner segments 332 and the wall segments 330 are mechanically connected together at the interfaces between the free ends 344 and the receiver sockets 348. The corner segments 332 and the wall segments 330 are thus connected together in an alternating arrangement to form a continuous ring that defines the z-axis section 318, as shown in FIG. 14. The z-axis section 318 can then be used alone or arranged within a stack with other z-axis sections 318 to build an electronics enclosure 310 (FIG. 15).

Although four of each are shown, any number of corner segments 332 and any number of the wall segments 330 may be connected together to define the z-axis section 318, which may have any other shape than the square shape shown herein. The z-axis section 318 may be referred to herein as a "first", a "second", and/or a "third" z-axis section. Moreover, the z-axis section 318 may be referred to herein as an "additional" z-axis section. Each wall segment 330 may be referred to herein as a "first" and/or a "second" wall segment. Each corner segment 332 may be referred to herein as a "first" and/or a "second" corner segment. Each receiver socket 348 may be referred to herein as a "first" and/or a "second" receiver socket.

In the exemplary embodiment of the z-axis section 318, the corner segments 332 include external mounting feature 366 for mounting of one or more support structures to the electronics enclosure 310 of the z-axis section 318, for example to facilitate supporting, mounting, compression, and/or the like of the electronics enclosure. In the exemplary embodiment of the z-axis section 318, the external mounting features 366 are grooves 366a that are configured to receive a key 372 (FIG. 15) of a support rail 373 (FIG. 15) for mounting the support rail 373 to the z-axis section 318. In addition or alternatively to the groove 366a, the external mounting feature 366 may include any other structure that enables the support structure to be mounted to the z-axis section 318, such as, but not limited to, an opening that receives a fastener, a clip, a slot, a latch, an interference-fit member, a snap-fit member, and/or the like. Moreover, in addition or alternatively to the external mounting feature 366 on the corner segment 332, the z-axis section 318 may include one or more external mounting features 366 positioned at another location, for example along a wall segment 330.

Figure 15:
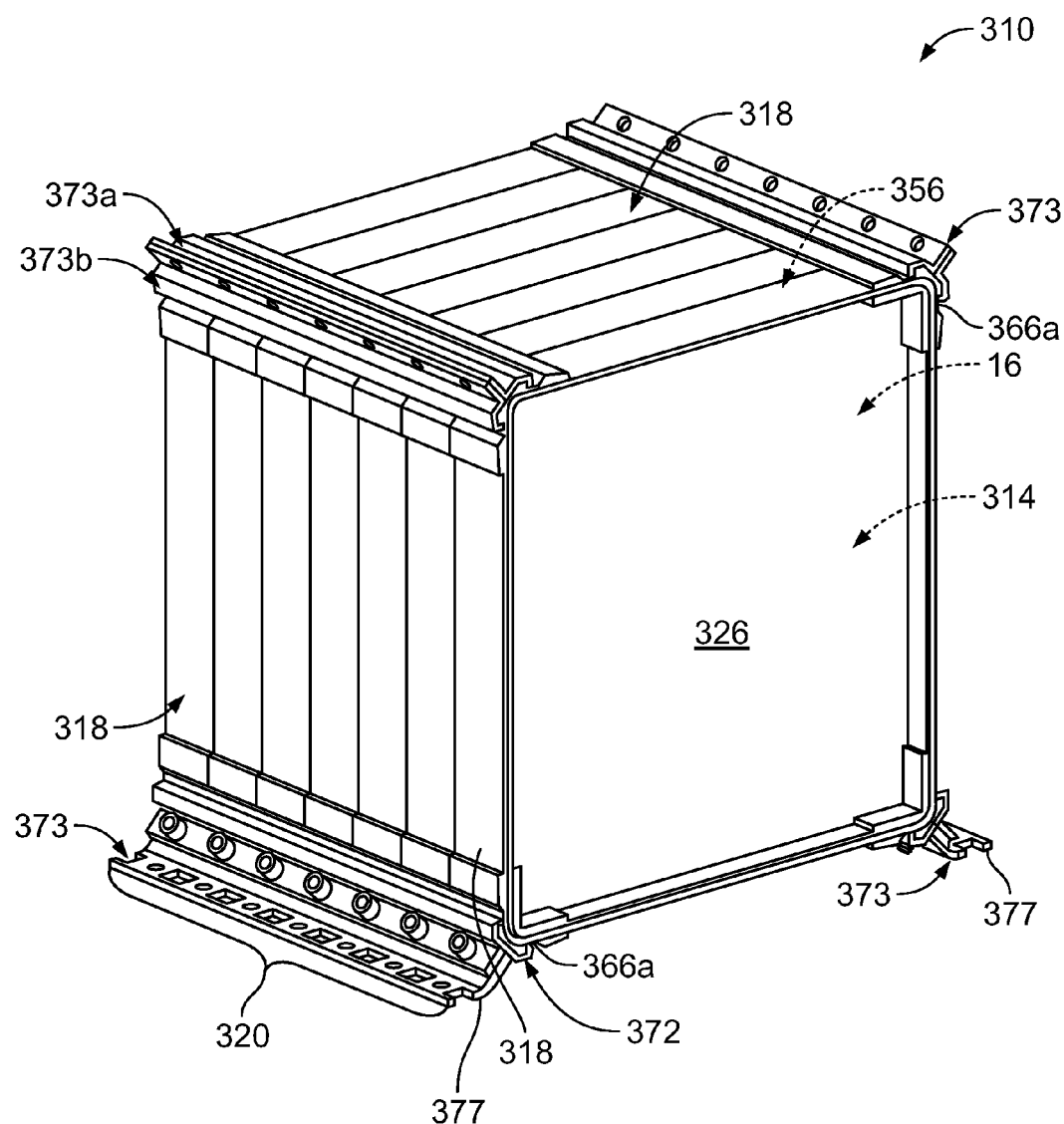
FIG. 15 is a perspective view of an exemplary embodiment of an enclosure built using the z-axis section shown in FIG. 14.

FIG. 15 is a perspective view of an exemplary embodiment of the electronics enclosure 310. The electronics enclosure 310 is formed by one or more z-axis sections 318. The z-axis dimension of the electronics enclosure 310 may be pre-selected by selecting the number of z-axis sections 318 that make up the stack 320. In the exemplary embodiment, the electronics enclosure 310 includes seven z-axis sections 318 arranged within the stack 320. But, the electronics enclosure 310 may include any number of z-axis sections 318. The z-axis dimension of the electronics enclosure 310 is scalable by selecting the number of z-axis sections 318 that are stacked on top of each other. In other words, the z-axis sections 318 are modular sections that provide standard (i.e., universal) building blocks that can be stacked together in any number to build an electronics enclosure 310 having any z-axis dimension. The internal cavity 356 of each z-axis section 318 defines a corresponding portion of the internal compartment 314 of the electronics enclosure 310. At least one of the z-axis sections 318 holds an electronic device 16, while at least one of the z-axis sections 318 includes a cover 326.

In the exemplary embodiment of the electronics enclosure 310, the electronics enclosure 310 has the overall shape of parallelepiped. But, the overall shape of the electronics enclosure 310 is not limited to a parallelepiped shape, nor are the z-axis sections 318 limited to a square shape. Rather, the z-axis sections 318 may have any other shape in the x-y plane and the electronics enclosure 310 may have any other overall shape.

The electronics enclosure 310 is shown in FIG. 15 as including a plurality of the optional support rails 373 mounted on the grooves 366a to facilitate supporting, mounting, compression, and/or the like of the electronics enclosure 310. Each support rail 373 extends along the z-axis of the enclosure 10 and is mounted to all of the z-axis sections 18 to hold the z-axis sections 18 together in the stack 20. As shown in FIG. 15, one or more of the support rails 373 optionally includes a foot 377 for supporting the enclosure 310 on a surface. Optionally, the support rails 373 are clamps that include two members 373a and 373b that clamp to the corner segments 332 of the z-axis sections 318, as is shown in FIG. 15.

Figure 16:
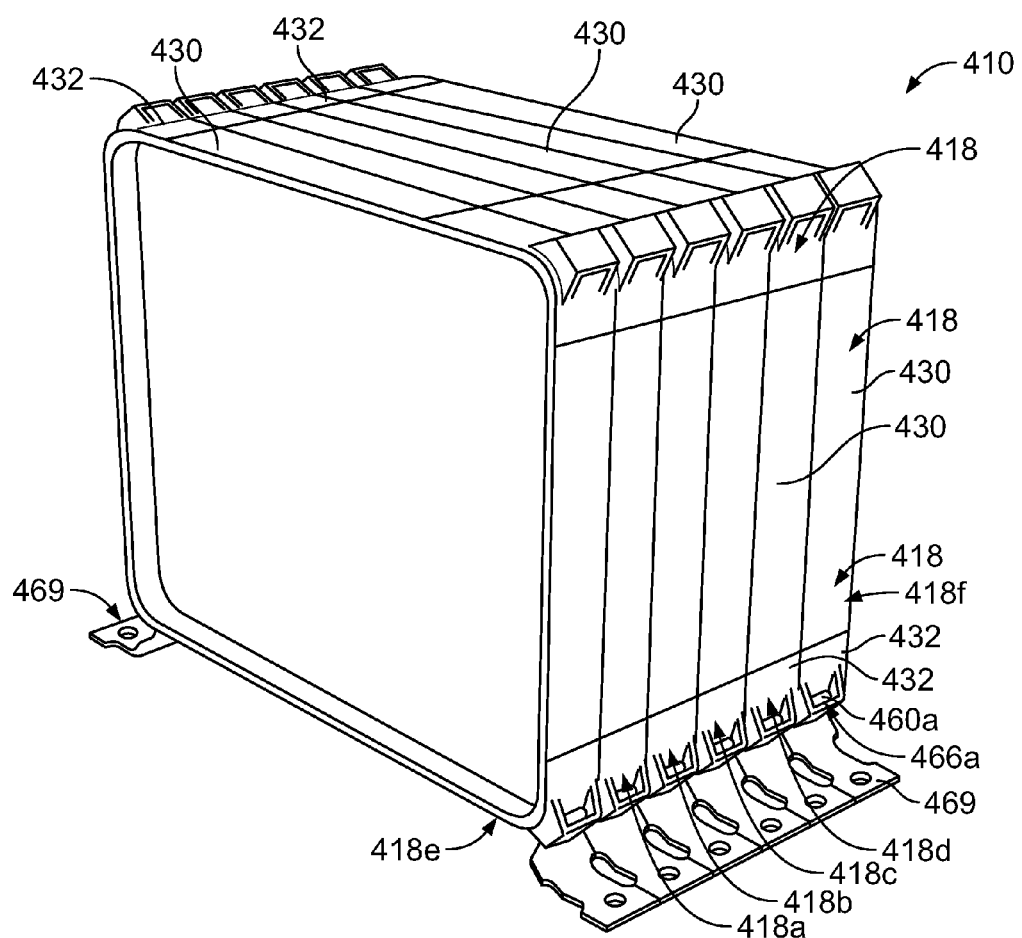
FIG. 16 is a perspective view of another exemplary embodiment of an enclosure.
Figure 17:
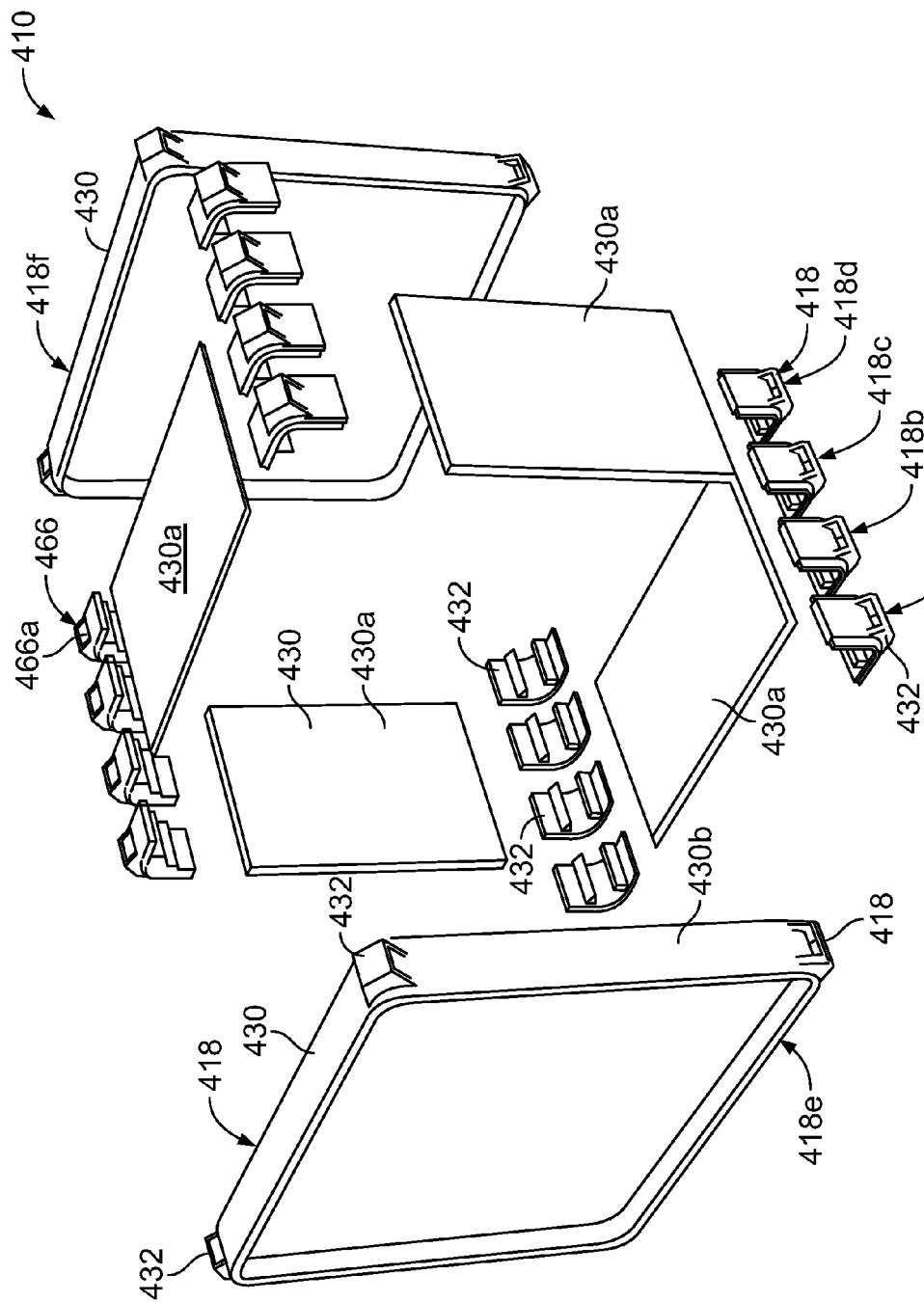
FIG. 17 is an exploded perspective view of the enclosure shown in FIG. 16.

FIG. 16 is a perspective view of another exemplary embodiment of an electronics enclosure 410. FIG. 17 is an exploded perspective view of the electronics enclosure 410. Referring now to FIGS. 16 and 17, the electronics enclosure 410 is formed by one or more z-axis sections 418. Each z-axis section 418 is substantially similar to the z-axis sections 318 (FIGS. 14 and 15), except at least some of the modular wall segments 430 of the z-axis sections 418 are shared between two or more z-axis sections 418. Specifically, at least some of the wall segments 430 are mechanically connected to the modular corner segments 432 of more than one z-axis section 418. In the exemplary embodiment of the electronics enclosure 410, wall segments 430a are shared by interior z-axis sections 418a, 418b, 418c, and 418d of the electronics enclosure 410. Each wall segment 430 may be shared by any number of z-axis sections 418. Optionally, one or more of the z-axis sections 418 does not include a wall segment 430 that is shared by another z-axis section 418. For example, the wall segments 430b of end z-axis sections 418e and 418f of the electronics enclosure 410 are not shared by another z-axis section 418.

As can be seen in FIGS. 16 and 17, the z-axis sections 418 include external mounting features 466 in the form of angled foot receivers 466a that receive angled feet 469 (FIG. 16) therein. The angled feet 469 optionally include compressible members 471 that are compressed as they are received within the corresponding receiver 466a to create an interference fit therebetween that holds the angled foot 469 within the corresponding receiver 466a. As shown in FIG. 16, the angled feet 469 optionally extend along and are optionally mounted to a plurality of the z-axis sections 418 to hold the z-axis sections 18 together in the stack 20.

Figure 18:
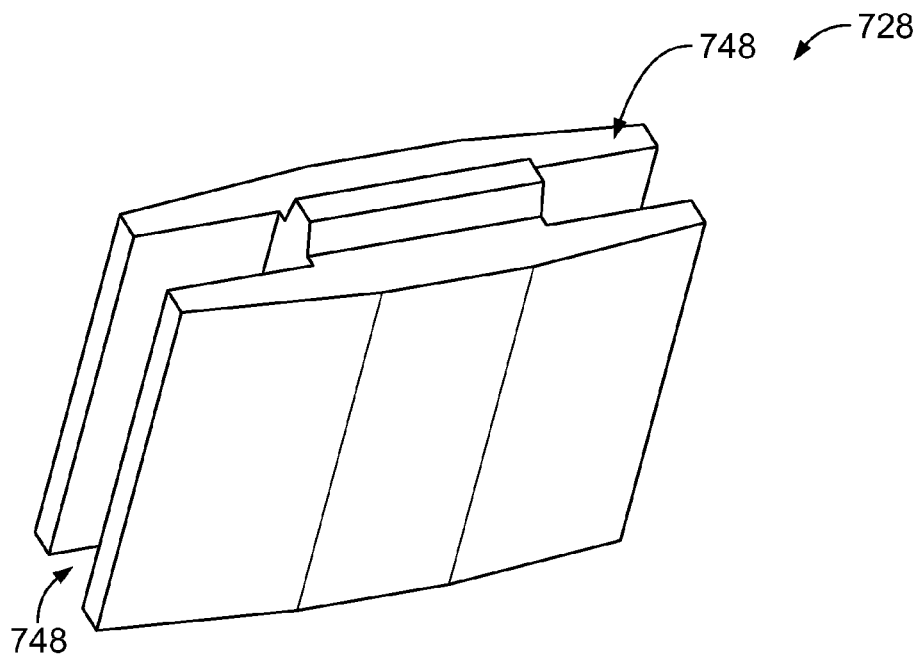
FIG. 18 is a perspective view of an exemplary embodiment of a modular extension construction unit.

FIG. 18 is a perspective view of an exemplary embodiment of a modular extension construction unit 728. The extension construction unit 728 includes two receiver sockets 748. The extension construction unit 728 is configured to be used with the wall segment 230 (FIGS. 11-13) and/or 330 (FIGS. 14 and 15), which include the free ends 244 and 344, respectively. The receiver sockets 748 of the modular extension construction unit 728 are each configured to receive the free end 244 or 344 of a corresponding wall segment 230 or 330, respectively. As shown in FIG. 18, the receiver sockets 748 of the extension construction unit 728 have an angle of approximately 0° relative to each other such that the entirety of the length of the extension one piece construction unit 728 is approximately straight. The construction unit 728 optionally includes one or more of the internal mounting features (not shown) for mounting one or more electronic and/or other devices 16 (FIGS. 6 and 10) to the extension construction unit 728. Moreover, the extension construction unit 728 optionally includes a strengthening boss (not shown) that may add rigidity and/or strength to the enclosure 10 by forming a reinforcing rib that extends along the z-axis.

The extension construction unit 728 may be used with one or more wall segments 230 or 330 along one or more of sidewalls of the electronics enclosure 310 (FIG. 15). Specifically, the extension construction unit 728 may be connected with one or more wall segments 230 or 330 within the ring of a z-axis section 318 (FIGS. 14 and 15) of the electronics enclosure 310 to extend the maximum x-axis and y-axis dimensions to which the z-axis section 318, and thus the electronics enclosure 310, is capable of being built. It should be understood that in embodiments that include one or more extension construction units 728, the extension construction unit 728 interrupts the alternating arrangement of the corner segments (e.g., the corner segments 232 and 332) and the wall segments of the corresponding z-axis section (e.g., the z-axis section 318). Moreover, the extension construction unit 728 may have a height along the z-axis that spans two or more z-axis sections of the enclosure, such that the extension construction unit 728 may be used with, for example, the enclosure 410 (FIGS. 16 and 17). The height of the extension construction unit 728 may span any number of z-axis sections of the enclosure, whether or not the number of z-axis sections spanned by the extension construction unit 728 is the same or different than the overall number of z-axis sections that define the enclosure 10 (i.e., the number of z-axis sections that the enclosure includes).

Figure 19:
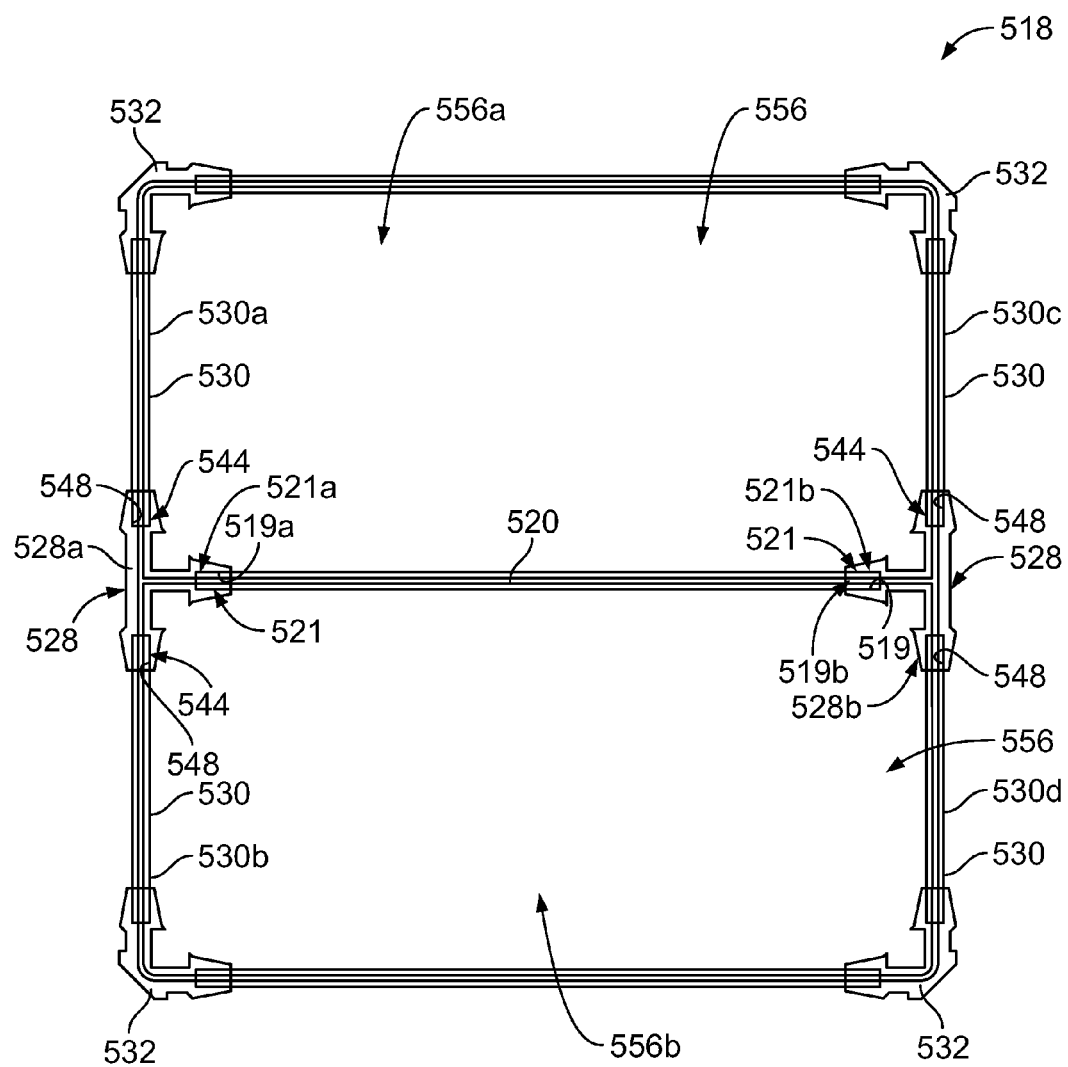
FIG. 19 is a plan view of an exemplary embodiment of a z-axis section that includes an exemplary embodiment of a partition.

The enclosures described and/or illustrated herein (e.g., the enclosures 10, 310, and 410) may include one or more partitions that divide the internal cavity (e.g., the internal cavity 56, 256, and 356) of one or more of the z-axis sections (e.g., the z-axis sections 18, 218, 318, and 418) into two or more sub-cavities. For example, FIG. 19 is a plan view of an exemplary embodiment of a z-axis section 518 that includes an exemplary embodiment of a partition 520. The exemplary embodiment of the z-axis section 518 includes a plurality of modular corner segments 532 and a plurality of modular wall segments 530 that connect together in the x-y plane to define an internal cavity 556 of the z-axis section 518. The corner segments 532 and the wall segments 530 connect together in an alternating arrangement to form the z-axis section 518. The z-axis section 518 can then be used alone or arranged within a stack with other z-axis sections 518 to build an enclosure (not shown), wherein the internal cavity 556 of the z-axis section 518 defines at least a portion of an internal compartment (not shown) of the enclosure. The z-axis section 518 may be referred to herein as a "first", a "second", and/or a "third" z-axis section. Moreover, the z-axis section 518 may be referred to herein as an "additional" z-axis section.

The exemplary embodiment of the partition 520 divides an internal cavity 556 of the z-axis section 518 into two sub-cavities 556a and 556b. The partition 520 is held in place by modular partition construction units 528 that are each interconnected between the free ends 544 of two adjacent corresponding wall segments 530 of the z-axis section 518. Alternatively, a wall segment 530 of the z-axis section 518 is severed along the length of the wall segment 530 and a partition construction unit 528 is interconnected between the severed ends of the wall segment 530.

Figure 20:
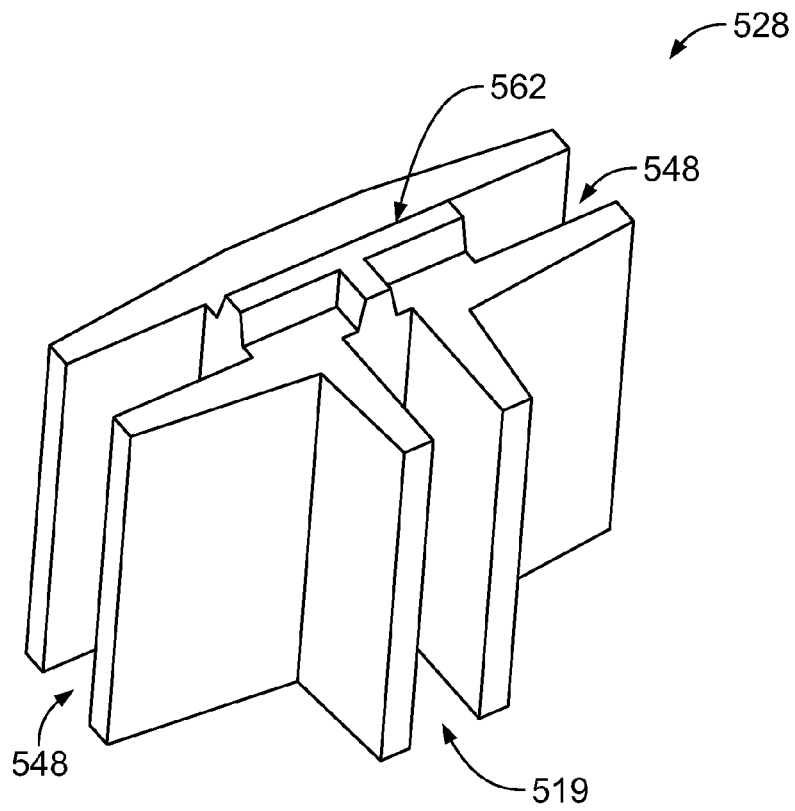
FIG. 20 is a perspective view of an exemplary embodiment of a partition construction unit of the z-axis section shown in FIG. 19.

FIG. 20 is a perspective view of an exemplary embodiment of a partition construction unit 528. Referring now to FIGS. 19 and 20, each partition construction unit 528 includes two receiver sockets 548. The receiver sockets 548 are each configured to receive the free end 544 of a corresponding wall segment 530. As shown in FIGS. 19 and 20, in the exemplary embodiment, the receiver sockets 548 of the partition construction unit 528 have an angle of approximately 0° (i.e., approximately parallel) relative to each other.

The partition construction unit 528 includes a partition socket 519, which as can be seen in FIG. 19 receives a corresponding free end 521 of the partition 520 therein. Reception of the free ends 521 within the corresponding partition socket 519 mechanically connects the partition 520 to the partition construction unit 528. Each free end 521 is optionally received within the corresponding partition socket 519 with an interference and/or snap fit. For example, the interference and/or snap fit may be provided by a detent arrangement, a dimple/divot arrangement, a bar/groove arrangement, another arrangement, and/or the like. Whether or not the free end 521 is received within the corresponding partition socket 519 with an interference and/or snap fit, one or more other structures and/or materials is optionally used to strengthen the mechanical connection at, and/or seal, the interface between the free end 521 and the corresponding partition socket 519, such as, but not limited to, a weld, an adhesive, a fastener, a clip, a latch, a clamp, and/or the like. In some embodiments, the adhesive is an activatable adhesive system.

In the exemplary embodiment, the partition socket 519 extends approximately perpendicular (i.e., approximately 90°) to the receiver sockets 548, as can be seen in FIG. 19. The approximately parallel orientation of the receiver sockets 548 and the approximately perpendicular orientation of the partition socket 519 (relative to the approximately parallel receiver sockets 548) provides the partition construction unit 528 with a "T" shape in the exemplary embodiment. But, the partition socket 519 may extend at any other angle relative to the receiver sockets 548, such as, but not limited to, between approximately 10° and approximately 170°.

Each partition construction unit 528 optionally includes one or more of the internal mounting features (not shown) for mounting one or more electronic and/or other devices 16 (FIGS. 6 and 10) to the partition construction unit 528. Moreover, each partition construction unit 528 optionally includes a strengthening boss (not shown) that may add rigidity and/or strength to the corresponding enclosure by forming a reinforcing rib that extends along the z-axis. Each partition construction unit 528 optionally includes one or more stacking features 562 (not shown in FIG. 19) for stacking the z-axis section 518 on another z-axis section. It should be understood that in embodiments that include one or more partition construction units 528 wherein one or more partition construction units 528 is interconnected between two adjacent wall segments 530, the partition construction unit(s) 528 interrupts the alternating arrangement of the corner segments 532 and the wall segments 530 of the z-axis section 518.

Referring again solely to FIG. 19, the exemplary embodiment of the z-axis section 518 includes two partition construction units 528a and 528b. In the exemplary embodiment, the partition construction unit 528a is interconnected between wall segments 530a and 530b of the z-axis section 518, and the partition construction unit 528b is interconnected between wall segments 530c and 530d of the z-axis section 518 that generally oppose the wall segments 530a and 530b. Free ends 521a and 521b of the partition 520 are received within respective partition sockets 519a and 519b of the partition construction 528a and 528b, respectively. The partition 520 spans the internal cavity 556 of the z-axis section 518 from the partition construction unit 528a to the partition construction unit 528b. The partition 520 thereby divides the internal cavity 556 into the two sub-cavities 556a and 556b of the z-axis section 518.

In the exemplary embodiment, the z-axis section 518 includes a single partition 520 that divides the internal cavity 556 of the z-axis section 518 into two sub-cavities 556a and 556b. But, the z-axis section 518 may include any number of partitions 520 for dividing the internal cavity 556 into any number of sub-cavities. Each sub-cavity may have any size and any shape. Moreover, although a length of the partition 520 is shown as extending approximately straight (e.g., between the partition construction units 528a and 528b) in the exemplary embodiment, additionally or alternatively the length of each partition 520 may include any other shape. For example, a partition 520 may be angled shape and/or curved along the length of the partition 520. The z-axis section 518 is not limited to the pattern (i.e., relative shape, relative size, relative position, relative location, relative orientation, and/or the like) of the sub-cavities 556a and 556b shown herein. Rather, the z-axis section 518 may additionally or alternatively include any other pattern of sub-cavities. Optionally, one or more of the partition(s) 520 includes a cover (not shown) that defines a z-axis boundary of the sub-cavity defined by the partition(s) 520.

In embodiments wherein the z-axis section 518 includes more than one partition 520, free ends 521 of different partitions 520 may be interconnected to provide a continuous divider within the internal cavity 556 of the z-axis section 518. The free ends 521 of different partitions 520 may be interconnected using modular internal partition construction units (not shown) that are similar to the partition construction units 528 and the corner segments 532. Specifically, the internal partition construction units include at least two partition sockets 519 that receive the free ends 521 of the different partitions 520. Each internal partition construction unit may include any number of partition sockets 519 for interconnecting any number of different partitions 520. Moreover, the partition sockets 519 of an internal partition construction unit may extend at any angle relative to each other (i.e., may have any pattern). For example, each internal partition construction unit may include, but not limited to including, two partition sockets 519 for interconnecting two different partitions 520 (e.g., two partition sockets 519 that are angled approximately parallel, approximately perpendicular, or at an oblique angle relative to each other), three partition sockets 519 for interconnecting three different partitions 520 (e.g., three partition sockets 519 that define a "T" shape or define another shape), four partition sockets 519 for interconnecting four different partitions 520 (e.g., four partition sockets 519 that define a cross shape or define another shape), and/or the like.

Optionally, in addition or alternatively to the partitions 520, the z-axis section 518 includes one or more partitions (not shown) that extend along an exterior side 523 of the z-axis section 518 instead of within the internal cavity 556, for example for providing a partition between the enclosure defined by the z-axis section 518 and another enclosure. Although shown as extending only along the z-axis section 518, each partition 520 may extend along any number of z-axis sections of the enclosure that includes the z-axis section 518. In other words, each partition 520 may extend along any amount of the z-axis dimension of the enclosure that includes the z-axis section 518. For example, in some embodiments, one or more partitions 520 extends along an approximate entirety of the z-axis dimension of the enclosure.

Although shown as used with a z-axis section 518 having corner segments 532 and wall segments 530, the partitions described and/or illustrated herein may be used with an enclosure and/or z-axis section described and/or illustrated herein (e.g., with an z-axis section that includes a construction unit that includes both a receiver socket and a wall segment, such as, but not limited to, the construction units 28 shown and described herein).

In some embodiments, a kit is provided for forming an electronics enclosure. The kit includes a plurality of modular construction units that connect together to at least partially define an internal compartment of the electronics enclosure. Each construction unit includes a wall segment extending a length from a corner end to a free end, and a corner segment extending outward from the corner end of the wall segment. The corner segment is integrally formed with the wall segment. The corner segment includes a receiver socket that is configured to receive the free end of another corresponding construction unit therein to connect the construction units together. Sub-groups of the construction units connect together one after the other with a chasing symmetry to define z-axis sections that are stackable to form the electronics enclosure. The kit may include all the pieces needed to construct an enclosure between a minimal set of dimensions up to a maximum combined set of dimensions. Multiple sized kits may be done to allow for different maximum dimensions. The kit may include, in addition to standard wall components, items such as universal internal mounts, outer mounting rails, and/or adhesive systems.

The embodiments described and/or illustrated herein describes modular construction units that provide standard (i.e., universal) building blocks that can be connected together to build a z-axis section of any size and shape. The modular z-axis sections of the embodiments described and/or illustrated herein provide standard (i.e., universal) building blocks that can be stacked together in any number to build an electronics enclosure having any z-axis dimension. The embodiments described and/or illustrated herein thus provide modular construction units that can be connected together to build an electronics enclosure having any size and shape. The embodiments described and/or illustrated herein may enable relatively rapid manufacturing of a new electronics enclosure from stock pieces on hand to any desired dimensions.

The construction units of the embodiments described and/or illustrated herein may be fabricated from the same mold or extrusion die, which may eliminate the need to provide different molds and/or dies for producing differently sized and/or shaped electronics enclosures. Moreover, the construction units described and/or illustrated herein may enable accelerated production of different electronics enclosures by eliminating the time it takes to fabricate such additional molds and/or dies.

The embodiments described and/or illustrated herein may provide an electronics enclosure that has an increased rigidity and/or a decreased number of joints as compared to at least some known electronics enclosures. The embodiments described and/or illustrated herein may provide an electronics enclosure that has a reduced weight as compared to at least some known electronics enclosures. The embodiments described and/or illustrated herein may provide an electronics enclosure having one or more covers that adequately closes an open end, top, and/or bottom of the enclosure.

As used herein, the term "ring" is not limited to a circular or otherwise curved shape. As used herein, an element or step recited in the singular and proceeded with the word "a" or "an" should be understood as not excluding plural of said elements or steps, unless such exclusion is explicitly stated. Furthermore, references to "one embodiment" or "an embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An enclosure comprising:
   a plurality of z-axis sections stacked along a z-axis, each of the z-axis sections including a plurality of modular construction units connected together, wherein each modular construction unit comprises:
      a wall segment having a height along the z-axis and extending a length from a corner end to a free end along an x-y plane, the x-y plane being perpendicular to the z-axis; and
      a corner segment extending outward from the corner end of the wall segment, the corner segment being integrally formed with the wall segment, the corner segment comprising a receiver socket that is configured to receive the free end of another corresponding modular construction unit therein to connect the modular construction units together; and
   wherein the modular construction units of a respective z-axis section are connected together one after the other along the x-y plane with a chasing symmetry to define the respective z-axis section, each of the z-axis sections having an internal cavity, the internal cavities of the plurality of z-axis sections combining to form an internal compartment of the enclosure.

2. The enclosure of claim 1, wherein at least some of the modular construction units are fabricated from a polymer.

3. The enclosure of claim 1, wherein at least two of the modular construction units are fabricated from different materials to provide the two modular construction units with different physical properties.

4. The enclosure of claim 1, wherein the z-axis sections include a top or bottom z-axis section, the top or bottom z-axis section including a cover that provides a boundary for the internal compartment, the modular construction units of the top or bottom z-axis section forming a slot that extends parallel to the x-y plane and receives an edge of the cover, the modular construction units of the top or bottom z-axis section engaging a top side of the cover and a bottom side of the cover to collectively hold the cover in a fixed position along the z-axis.

5. The enclosure of claim 1, wherein the height of each wall segment extends between first and second edges of the corresponding segment that extend parallel to each other, the wall segments being sized and shaped such that, after the corresponding wall segment is cut along the z-axis between the first and second edges to remove a section of the wall segment having the free end, the wall segment has a new free end that is also sized and shaped to be received by the receiver socket.

6. The enclosure of claim 1, wherein the enclosure has a z-axis dimension that is measured along the z-axis, the z-axis dimension of the enclosure being scalable by stacking one or more additional z-axis sections.

7. The enclosure of claim 1, wherein the receiver socket of each for at least some of the modular construction units extend at a non-orthogonal angle relative to the length of the wall segment of the corresponding modular construction unit.

8. The enclosure of claim 1, wherein each z-axis section of the plurality of z-axis sections of the enclosure includes four modular construction units, the receiver socket of each of the modular construction units of the plurality of z-axis sections being angled at approximately 90° relative to the length of the wall segment of the corresponding modular construction unit such that the enclosure has a four-sided shape.

9. The enclosure of claim 1, wherein the z-axis sections have a curved shape in the x-y plane or the shape of a parallelepiped.

10. The enclosure of claim 1, wherein the plurality of z-axis sections include first and second z-axis sections that are stacked together, the height of each of the wall segments of the first and second z-axis sections being defined between opposite first and second edges that extend along the length, the first edge of one of the wall segments of the first z-axis section directly engaging the second edge of one of the wall segments of the second z-axis section.

11. The enclosure of claim 1, wherein the plurality of z-axis sections includes first, second, and third z-axis sections that are stacked with respect to one another, wherein the second z-axis section comprises a radio frequency (RF) shield that extends perpendicular to the z-axis and between the internal cavities of the first and third z-axis sections to shield the internal cavities of the first and third z-axis sections from each other.

12. The enclosure of claim 1, wherein the plurality of z-axis sections include first and second z-axis sections that are stacked together, the height of each of the wall segments of the first and second z-axis sections being defined between opposite first and second edges that extend along the length, the first edge of one of the wall segments of the first z-axis section directly engaging the second edge of one of the wall segments of the second z-axis section, the first and second edges having an electrically conductive adhesive therebetween, the one wall segment of the first z-axis section and the one wall segment of the second z-axis section being electrically conductive.

13. The enclosure of claim 1, wherein the free ends of the modular construction units are mechanically connected to the receiver sockets of the corresponding modular construction units using at least one of a weld, an adhesive, an interference fit, or a snap fit.

14. The enclosure of claim 1, further comprising an electronic device disposed within the internal compartment, wherein the corner segments of the modular construction units of at least one z-axis section directly engage the electronic device.

15. The enclosure of claim 1, wherein the enclosure has a plurality of sidewalls, each of the sidewalls being defined by stacked wall segments of the z-axis sections, the wall segments of at least one of the sidewalls being electrically conductive.

16. The enclosure of claim 12, wherein the one wall segment of the first z-axis section is a first wall segment and the one wall segment of the second z-axis section is a second wall segment, the first and second wall segments forming at least a portion of a sidewall of the enclosure, the sidewall having a port therethrough for receiving an electrical conductor or an electrical connector, the port being defined by the first and second sidewalls.

17. The enclosure of claim 1, wherein each of the wall segments has opposite first and second edges along the length of the respective wall segment, the first edge of each wall segment directly engaging and interlocking with the second edge of an adjacent wall segment.

18. The enclosure of claim 17, wherein first edge includes a male feature and the second edge includes a female feature that receives the male feature.

19. An enclosure assembly comprising:
multiple sets of modular construction units in which each modular construction unit comprises:
a wall segment having a height along a z-axis, the wall segment extending a length from a corner end to a free end along an x-y plane that is perpendicular to the z-axis; and
a corner segment extending outward from the corner end of the wall segment, the corner segment being integrally formed with the wall segment, the corner segment comprising a receiver socket that is configured to receive the free end of another corresponding modular construction unit therein to connect the modular construction units together;
wherein each set of the modular construction units forms a corresponding z-axis section when the modular construction units of the set are connected to one another along the x-y plane in a chasing symmetry, the plurality of the z-axis sections forming an enclosure when stacked along the z-axis, the z-axis sections defining respective internal cavities that combine to form an internal compartment of the enclosure.

20. The enclosure assembly of claim 19, wherein the wall segments have opposite first and second edges along the lengths of the corresponding wall segments, the first edges of some wall segments directly engaging and interlocking with the second edges of adjacent wall segments when the z-axis sections are stacked along the z-axis.

21. The enclosure assembly of claim 19, wherein the height of each wall segment extends between first and second edges of the corresponding segment that extend parallel to each other, the wall segments being sized and shaped such that, after the corresponding wall segment is cut along the z-axis between the first and second edges to remove a section of the wall segment having the free end, the wall segment has a new free end that is also sized and shaped to be received by the receiver socket.

\* \* \* \* \*